(12) United States Patent
Tannous et al.

(10) Patent No.: US 7,101,260 B2
(45) Date of Patent: *Sep. 5, 2006

(54) METHODS FOR RESIST STRIPPING AND OTHER PROCESSES FOR CLEANING SURFACES SUBSTANTIALLY FREE OF CONTAMINANTS

(75) Inventors: Adel George Tannous, Santa Clara, CA (US); Khalid Makhamreh, Los Gatos, CA (US)

(73) Assignee: Nanoclean Technologies, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/046,104

(22) Filed: Jan. 28, 2005

(65) Prior Publication Data

US 2005/0263170 A1    Dec. 1, 2005

Related U.S. Application Data

(63) Continuation-in-part of application No. 10/894,626, filed on Jul. 19, 2004, now Pat. No. 7,040,961, which is a continuation of application No. 10/208,156, filed on Jul. 29, 2002, now Pat. No. 6,764,385.

(51) Int. Cl.
*C25F 3/30* (2006.01)
(52) U.S. Cl. .............................. 451/37; 451/39; 451/57; 134/1.1

(58) Field of Classification Search .................. 451/57, 451/67, 37, 39, 38; 134/1.1, 9, 7, 26, 34; 438/712
See application file for complete search history.

(56) References Cited

U.S. PATENT DOCUMENTS

| 4,466,946 A | 8/1984 | Goddin ........................ 423/228 |
| 4,793,103 A | 12/1988 | Baumgart ..................... 451/81 |

(Continued)

OTHER PUBLICATIONS

High Pressure Cleaning System for Disks, IBM Technical Disclosure Bulletin, Jan. 1983.

*Primary Examiner*—Jacob K. Ackun, Jr.
(74) *Attorney, Agent, or Firm*—Loudermilk & Associates

(57) ABSTRACT

A method for manufacturing an article where the article has polymeric residue that is to be removed during the manufacture of the article. The article is introduced into a controlled environment of a processing tool that has at least first and second processing chambers. Free radicals are generated from one or more reactant gases and introduced into at least the first processing chamber where they react with the polymeric residue. A cryogenic cleaning medium is supplied into the second processing chamber where it removes the polymeric residue present after the free radicals react with the polymeric residue. The reactant gases are selected to facilitate removal of the polymeric residue with the cryogenic cleaning medium The first and second processing chambers may be dedicated to plasma processing or cryogenic processing or each may provide both plasma processing and cryogenic processing.

19 Claims, 19 Drawing Sheets

U.S. PATENT DOCUMENTS

| | | | |
|---|---|---|---|
| 4,806,171 A | 2/1989 | Whitlock et al. ............... 134/7 |
| 4,854,091 A | 8/1989 | Hashish |
| 4,962,891 A | 10/1990 | Layden ........................ 239/597 |
| 5,015,331 A | 5/1991 | Powell ........................ 156/643 |
| 5,049,365 A | 9/1991 | Okabayashi .................. 95/146 |
| 5,062,898 A | 11/1991 | McDermott et al. ............ 134/7 |
| 5,074,083 A | 12/1991 | Kanno ......................... 451/75 |
| 5,107,764 A | 4/1992 | Gasparrini .................. 101/425 |
| 5,108,512 A | 4/1992 | Goffnett et al. ................. 134/7 |
| 5,209,028 A | 5/1993 | McDermott et al. .......... 51/426 |
| 5,217,925 A | 6/1993 | Ogawa et al. ............... 437/225 |
| 5,315,793 A | 5/1994 | Peterson et al. .............. 51/415 |
| 5,354,384 A | 10/1994 | Sneed et al. .................... 134/7 |
| 5,364,472 A | 11/1994 | Heyns et al. ................... 134/7 |
| 5,366,156 A | 11/1994 | Bauer ......................... 239/135 |
| 5,378,312 A | 1/1995 | Gifford ....................... 156/643 |
| 5,380,401 A | 1/1995 | Jones ......................... 438/712 |
| 5,417,768 A | 5/1995 | Smith, Jr. et al. ............. 134/10 |
| 5,456,629 A | 10/1995 | Bingham ..................... 451/39 |
| 5,456,759 A | 10/1995 | Stanford ....................... 134/1 |
| 5,482,564 A | 1/1996 | Douglas et al. ............... 134/18 |
| 5,505,219 A | 4/1996 | Lansberry ................... 134/105 |
| 5,514,024 A | 5/1996 | Goenka ....................... 451/39 |
| 5,564,159 A | 10/1996 | Treiber ........................ 15/302 |
| 5,571,335 A | 11/1996 | Lloyd ............................ 134/1 |
| 5,616,067 A | 4/1997 | Goenka ....................... 451/39 |
| 5,620,673 A | 4/1997 | Herden ....................... 423/240 |
| 5,632,150 A | 5/1997 | Henzler ....................... 62/52.1 |
| 5,651,723 A | 7/1997 | Bjornard ...................... 451/39 |
| 5,651,834 A | 7/1997 | Jon et al. ...................... 134/31 |
| 5,669,251 A | 9/1997 | Townsend et al. ............. 68/58 |
| 5,715,852 A | 2/1998 | Jepsen ........................ 134/167 |
| 5,733,174 A | 3/1998 | Bingham et al. ............. 451/39 |
| 5,754,580 A | 5/1998 | Kotani et al. ................. 372/61 |
| 5,765,578 A | 6/1998 | Brandt et al. ................. 134/7 |
| 5,766,061 A | 6/1998 | Bowers ........................ 451/89 |
| 5,766,368 A | 6/1998 | Bowers ........................ 134/6 |
| 5,775,127 A | 7/1998 | Zito ............................. 62/603 |
| 5,794,854 A | 8/1998 | Yie ............................. 239/242 |
| 5,795,831 A | 8/1998 | Nakayama et al. ......... 438/714 |
| 5,804,826 A | 9/1998 | Borden et al. ............... 250/343 |
| 5,806,544 A | 9/1998 | Kosic ........................... 134/68 |
| 5,810,942 A | 9/1998 | Narayanswami ............... 134/7 |
| 5,833,918 A | 11/1998 | Matossian et al. .......... 266/251 |
| 5,836,809 A | 11/1998 | Kosic ........................... 451/89 |
| 5,837,064 A | 11/1998 | Bowers ......................... 134/6 |
| 5,853,128 A | 12/1998 | Bowen et al. .............. 239/329 |
| 5,853,962 A | 12/1998 | Bowers ....................... 430/331 |
| 5,858,107 A | 1/1999 | Chao et al. ..................... 134/1 |
| 5,863,170 A | 1/1999 | Boitnott et al. .............. 414/222 |
| 5,882,489 A | 3/1999 | Bersin et al. ........... 204/192.35 |
| 5,908,319 A | 6/1999 | Xu et al. ..................... 438/725 |
| 5,914,278 A | 6/1999 | Boitnott et al. .............. 438/724 |
| 5,928,434 A | 7/1999 | Goenka .......................... 134/2 |
| 5,931,721 A | 8/1999 | Rose |
| 5,961,732 A | 10/1999 | Patrin et al. .................... 134/7 |
| 5,967,156 A | 10/1999 | Rose .............................. 134/7 |
| 5,976,264 A | 11/1999 | McCullough .................. 134/2 |
| 5,989,355 A | 11/1999 | Brandt et al. ................... 134/6 |
| 6,004,399 A | 12/1999 | Wong ............................. 134/2 |
| 6,066,032 A | 5/2000 | Borden et al. ................. 451/80 |
| 6,099,396 A | 8/2000 | Krone-Schmidt ............. 451/80 |
| 6,126,524 A | 10/2000 | Shepherd ...................... 451/75 |
| 6,187,684 B1 | 2/2001 | Farber et al. ................ 438/704 |
| 6,200,393 B1 | 3/2001 | Romack ....................... 134/10 |
| 6,203,406 B1 | 3/2001 | Rose ........................... 451/39 |
| 6,273,790 B1 | 8/2001 | Neese et al. ................... 451/38 |
| 6,280,585 B1 | 8/2001 | Obinata et al. ......... 204/298.19 |
| 6,296,716 B1 | 10/2001 | Haerle ............................ 134/7 |
| 6,303,047 B1 | 10/2001 | Aronowitz ..................... 252/1 |
| 6,412,497 B1 | 7/2002 | Li ............................... 134/1.1 |
| 6,530,823 B1 | 3/2003 | Ahmadi ...................... 451/39 |
| 6,531,436 B1 | 3/2003 | Sahbari ....................... 510/176 |
| 6,536,059 B1 | 3/2003 | McClain ......................... 8/158 |
| 6,543,462 B1 | 4/2003 | Lewis ......................... 134/144 |
| 6,558,475 B1 | 5/2003 | Jur et al. ...................... 134/21 |
| 6,565,667 B1 | 5/2003 | Haerle ............................ 134/7 |
| 6,572,457 B1 | 6/2003 | DePalma ...................... 451/89 |
| 6,719,613 B1 | 4/2004 | Ahmadi ....................... 451/39 |
| 6,764,385 B1 * | 7/2004 | Boumerzoug et al. ........ 451/39 |
| 6,838,015 B1 | 1/2005 | Cotte ......................... 252/79.1 |
| 6,945,853 B1 | 9/2005 | Ahmadi ....................... 451/39 |
| 6,949,145 B1 | 9/2005 | Banerjee ........................ 134/1 |

* cited by examiner

METHODS FOR RESIST STRIPPING AND OTHER PROCESSES FOR CLEANING SURFACES SUBSTANTIALLY FREE OF CONTAMINANTS

This application is a continuation in part of application Ser. No. 10/894,626 now U.S. Pat. No. 7,040,961, which is a continuation of application Ser. No. 10/208,156, now U.S. Pat. No. 6,764,385.

FIELD OF THE INVENTION

This invention relates to systems and methods for removing photoresist or other materials from an integrated circuit structure with a dry process, preferably in a vacuum stripping chamber, such as photoresist remaining after etch, implant or other fabrication steps. The invented system and method also can desirably remove etch residues remaining from previous fabrication step(s). The present invention also is suitable for cleaning surfaces on hard disks, semiconductor wafers, delicate optics, etc. The present invention more particularly relates to a preferably oscillating or/and pulsating nozzle cleaning system, preferably dispensing cryogenic, solvent or solvent combination cleaning mediums, combined with plasma excited reactive gases. The oscillating nozzle cleaning and plasma processes can be performed sequentially or simultaneously. The present invention also relates to other dry or plasma type processes that are combined with or followed by cryogenic cleaning type process.

BACKGROUND OF THE INVENTION

Articles such as hard disks, semiconductor wafers, delicate optics, MEMS (micro electro-mechanical systems), flat panel displays, masks, reticles etc., often must be precisely cleaned in order to remove contaminants, either during or after a process for manufacturing the articles. For example, resist strip and residue clean typically are needed between etch, implant and deposition steps in IC fabrication processes. Conventional dry-type strip/clean sequences typically use plasma to ash resist and wet chemicals to clean residues. Resist stripping is typically carried out using dry plasma ashing. Conventional $O_2$ plasma ashing at high temperature tends to leave polymeric residues that require acids and/or organic solvents for removal. Wet chemistries generally are not desirable due to non-uniformities, selectivity to exposed layers and incomplete resist removal because of mass transport and surface tension associated with the solutions. A variety of alternative cleaning methods have been employed with varying degrees of success. Certain of such methods that have been attempted involve imparting carbon dioxide snow onto the article to be cleaned. An example of such a conventional carbon dioxide cleaning system is described in U.S. Pat. No. 5,766,061.

Conventional systems generally require multiple tools and multiple processes in which articles to be processed have to be moved from one piece of equipment in order to carry out the desired processing. In addition, the processes used in conventional systems generally combine wet and dry processes, which may be batch or single article systems. For example, in a typical post-etch wafer strip/clean, a semiconductor wafer will go through an asher to remove the bulk of photoresist and once a batch of 25 or so wafers are processed through the asher they are thereafter placed in a cassette and placed in a wet bench. The wafers are processed in the wet bench typically by being moved into multiple chemical sinks to clean the residues, then through a sink of DI water to remove the solvent and finally they are moved to a dryer module to dry the wafers. Such conventional systems have many shortcomings. For example, there tends to be a high capital cost due to the multiple pieces of equipment that are required. There also tends to be a high cost per wafer for the cleaning process due to the price of chemicals and chemical disposal, which often involves the use of hazardous chemicals. There also is lowered throughput due to the wafer transport time from one piece of equipment to the next. Also, wet processes tend to affect material properties such as via corrosion of metal, particularly with copper, and changes in dielectric constant value, particularly with low-k dielectric materials. In addition, in conventional methods semiconductor wafers typically leave the vacuum environment after photoresist stripping and prior to wet cleaning. The exposure to atmospheric air often causes an oxide layer to form, which increases the level of difficulty of cleaning.

SUMMARY OF THE INVENTION

The present invention relates to systems and methods preferably using a plasma process and a cryogenic cleaning process. Certain preferred embodiments employ a plasma generation system, as a chemical means, for resist and polymer residue removal and a preferably cryogenic cleaning medium, as a physical means, for enhancing the cleaning of an exposed surface of an article in a single integrated process tool. Without being bound by theory, the cryogenic cleaning medium is believed to help in reducing submicron defects. The plasma source preferably is either a remote source that provides free radicals or an ion assisted chemistry activated by direct exposure of the wafer to a preferably RF plasma In certain alternative preferred embodiments, the free radicals/ions ratio can be controlled by running simultaneously both sources (remote and RF sources). The cryogenic and plasma processes can be performed sequentially or simultaneously in the same chamber or in two separate chambers.

Integrated, preferably all dry systems and methods in accordance with the present invention can eliminate problems associated with current conventional systems. The present invention also provides technological, environmental as well as economical advantages over such conventional systems. Such advantages include: more effective cleaning by performing all processes in a vacuum environment; using an all dry method which is able to penetrate high aspect ratio vias and trenches due to lower surface tension than liquid; combining chemical and physical mechanisms; lowered capital costs by reducing the number of the pieces of equipment required to accomplish the desired processing; a smaller footprint for the equipment, which tends to take up less space and reduces real estate cost, etc.; less human intervention and training than with multi-equipment conventional systems; lower costs of ownership and per article processing due to the elimination of many costly solvents; increased safety to both humans and the environment due to the elimination of many hazardous chemicals; higher yield due to the elimination of wet processes that negatively affect the materials used; higher throughput due to, for example, the elimination of article transport processes from one piece of equipment to the next and due to the elimination of the article drying process.

An exemplary preferred system/method can be described as follows. The articles to be cleaned preferably are placed in a special box on shelves. The box preferably has a front door that is locked and airtight. A loader is in communication with the front end of the box through an interface. The front end preferably consists of an enclosure with fan filter units placed on the top to provide a clean particle free environment inside the enclosure, an atmospheric robot to transfer the articles, and a pre-aligner to align the orientation of the articles (commonly provided in the case of semiconductor wafers and the like). The box preferably is placed on the tool loader. The loader opens up a door in the box to allow the atmospheric robot to access the articles/wafers. The atmospheric robot preferably extends its arm to hold one article/wafer from the box and transfer it to the pre-aligner. The pre-aligner rotates the article/wafer and aligns it in to a predetermined rotational position. The atmospheric robot preferably picks up the article/wafer and delivers it to a vacuum robot located in a vacuum chamber adjacent to the front end and is in communication with the front end through an opening slot with a door. The door preferably then closes and allows the robot vacuum chamber to be pumped down. The robot vacuum chamber, which often is referred to as a vacuum transfer chamber, is then pumped down to a low vacuum. The vacuum transfer chamber preferably is interfaced with the connected one or multiple vacuum process chambers through opening slots and doors. Each vacuum process chamber could contain all the mechanisms required to perform the strip/clean process as described elsewhere herein, which include mechanisms for introducing the plasma excited reactive gases and the pulsating cryogenic flow spray. Alternatively, the mechanisms for introducing the plasma excited reactive gases may be provided in a separate vacuum chamber from the chamber in which the mechanisms for pulsating cryogenic spray are provided. In the first case (both plasma and the cryogenic spray are in a single chamber) the vacuum robot places the wafer inside the process vacuum chamber. The interface door closes down and the vacuum chamber is pumped down to a predetermined vacuum level. The plasma excited reactive gases are provided to strip the photoresist (or to carry out another desired process). The cryogenic nozzle system is then turned on to clean the remaining residues that have been conditioned by the plasma steps to be removed by the preferably pulsating cryogenic spray. In one alternative embodiment (e.g., separate chambers are provided, one for the plasma processing and another for the cryogenic processing), the article/wafer has to be moved from one chamber to the next chamber after the plasma process is completed in order for the cryogenic cleaning process to occur, which can desirably remove remaining residues. The article/wafer may then be moved preferably to another box on another load port following a reverse path.

An exemplary preferred embodiment for photoresist stripping/cleaning system/method is as follows. An enclosure is provided for maintaining a controlled environment during the photoresist stripping (or post etch implant or other fabrication step) and residue cleaning process. The enclosure preferably provides ingress and egress from and to a surrounding environment. A holding chuck preferably is provided that is configured to secure the article to be cleaned of photoresist and/or other remaining polymeric or other residue. The environment preferably is pressure controlled (vacuum) to optimize the plasma reaction. A stage or stage means is mounted on the support structure and the holding chuck is mounted on the stage means in a manner so that the stage or stage means is fixed and the system allows a nozzle to move relative to it for complete surface coverage of the cryogenic gas. The stage or stage means, in alternative embodiments, is mounted on the support structure and the holding chuck is mounted on the stage means in a manner so that movement of the article relative to the support structure is provided within the enclosure on a predetermined path between the ingress and the egress points. A pre-heater, in certain embodiments, is mounted in a first position adjacent the predetermined path in thermal communication with the surface of the article at the first position. Reactive gases such as oxygen preferably are introduced through a remote plasma chamber. The processing chamber is connected to a vacuum exhaust line. A cryogenic spray nozzle assembly preferably is provided wherein a spray nozzle is mounted in the spray nozzle assembly. A cryogenic spray nozzle assembly preferably is mounted on a slide mechanism in a manner so that the cryogenic spray nozzle assembly is allowed to be in a controlled fashion so that the cryogenic spray impinges on the surface of the article to be cleaned in a predetermined path. The spray nozzle is in communication with the cryogenic cleaning medium, preferably through a cryogenic purification system, for providing a purified cleaning spray. The cryogenic spray nozzle assembly, in preferred embodiments, is further connected outside the environment to an assembly or other means for imparting cyclic pulsating and/or cyclic motion in the spray nozzle so that the cleaning spray impinges dynamically, with a controlled frequency, relative to the predetermined path. This cyclic motion assembly or means alternatively could be internal to the environment.

In another aspect of the present invention, systems and methods are provided for cleaning a surface of an article, wherein a preferred system includes a framework, and a holding means that holds the article with the surface exposed. The plasma source preferably is separated remotely from the article that is being processed, with free radicals generated remotely. Ion assisted chemistries, optionally or in combination with the remotely generated free radicals, are provided preferably by direct exposure of the wafer to RF plasma The plasma also may be activated by both a remote source and an RF plasma source. In preferred embodiments, each form of plasma is independently controlled to cover a wide spectrum of processing conditions in a manner to satisfy the complexity and diversity of the residues. The present invention preferably involves placing the substrate (wafer or other article, etc.) in the plasma reactor, applying to the substrate surface an activated mixture of gases selected from the group consisting of oxygen, nitrogen, hydrogen, fluorine, hydro fluorocarbon, water vapor or a mixture of such gases to both remove the photoresist layer and alter the composition of the residues such that the residues are soluble in cryogenic fluid and/or have a weakened bonds that they can be removed with a stream of cryogenic cleaning medium.

With respect to the cryogenic cleaning assembly, a nozzle having a nozzle axis and nozzle tips preferably is spaced from and adjacent to the predetermined path for delivering a cleaning spray onto the article surface. Means preferably is mounted between the framework and the nozzle for supporting and driving the nozzle tips through a cyclic motion and/or causing the cryogenic flow to be provided in a pulsating manner.

In yet another aspect of the present invention, an oscillating, vibratory or pulsating nozzle assembly for use in cryogenic cleaning of a surface of an article that must be cleaned substantially free of contaminants is provided, particularly after or as part of a dry process as described herein. An oscillating nozzle assembly in accordance with certain exemplary preferred embodiments preferably includes an assembly mounting block, a nozzle mounting block, and means for resiliently connecting the nozzle mounting block to the assembly mounting block. Further, the oscillating nozzle assembly preferably connected to a pulsating valve includes a frequency controller. At least one nozzle preferably is included having nozzle tips, wherein the nozzle is connected to the pulsating valve so that the valve controller operates to produce pulsating flow at a controlled pulsation frequency. The flow pulsation is preferably accomplished through a piezoelectric system attached to the pulsating valve that produces a high frequency controlled pressure perturbation in the cryogenic flow at the outlet of the nozzle tips. Alternatively, the pulsation in the flow can be accomplished through a brushless motor with the shaft-inserted diagonal to the flow. The shaft of the brushless motor has one or multiple radial holes and rotates at a controlled frequency through a driver and controller.

Methods in accordance with preferred embodiments of the present invention relate to processing an article having a surface to be cleaned substantially free of contaminates. The process includes the steps of performing a plasma etching/ashing process or other dry process, preferably to remove a photoresist-type layer, a plurality of pre-cleaning fabrication steps, conducting a cleaning process using a cleaning spray, and performing a plurality of post-cleaning fabrication steps. The plasma step preferably involves placing the substrate (or other article) in the plasma reactor, applying to the substrate surface an activated mixture of gases selected from the group consisting of oxygen, nitrogen, hydrogen, fluorine, hydro fluorocarbon, water vapor or a mixture of such gases to both remove the photoresist layer and alter the composition of the residues such that the residues are soluble in water and/or have a weakened bonds that they can be removed with a stream of cryogenic medium.

The step of conducting a cleaning process preferably occurs in the same environment and includes the steps of turning the cryogenic flow on in a predetermined frequency of pulsation and moving the nozzle across the article to be cleaned in a predetermined path and controllable speed to sweep the whole surface of the article. Further, the step of pulsating the cleaning spray at the cleaning position in a predetermined pattern preferably is performed to provide improved cleaning in accordance with the present invention.

In certain exemplary preferred embodiments, the cryogenic spray assembly is enclosed inside the cryogenic vacuum chamber. The chamber preferably has a partition wall with a slot through which the cryogenic spray nozzle extends. The partition wall preferably divides the cryogenic spray chamber into two sections, one section with a track, drive motor and slide mechanism assembly, while the other section contains the article to be cleaned sitting on an electrostatic chuck and the cryogenic spray nozzle assembly. The slide mechanism and drive motor preferably are located on the bottom of the chamber at a lower level than the article to be cleaned in the neighboring section, while separated by the partition wall to prevent particulates that might be generated from being deposited on the article to be cleaned. The partition wall serves to reduce cross flow between the two sections, and also serves to protect the slide mechanism and drive motor from the plasma gases that are introduced on the article to be cleaned in the neighboring section while at the same time protecting the article to be cleaned from contamination that might be introduced by the slide mechanism and drive motor. In the event that particulates are generated from the slide mechanism and/or drive motor, preferably a vacuum port is provided in proximity (preferably below) to the slide mechanism and drive motor to allow such particulates to be transported outside the chamber. In alternative embodiments, the system is extended to a two-wafer chamber for higher wafer processing throughput. In this case the mechanism that moves the nozzles preferably are located in the center of the chamber and it drives both nozzle assemblies (or two sides of a single nozzle) at the same time.

In another aspect of certain preferred embodiments in accordance with the present invention, the cryogenic spray assembly preferably is enclosed inside the cryogenic vacuum chamber while the slide mechanism and drive motor are outside the vacuum chamber. In such embodiments, the cryogenic spray assembly shaft preferably is the only assembly part that is enclosed inside the cryogenic vacuum chamber and it penetrates the vacuum chamber somewhere above the position of the article to be cleaned, to allow the cryogenic spray nozzle to sweep over it. The cryogenic spray medium preferably enters the vacuum chamber to the nozzle thru a shaft that is connected to an all metal flexible tube to allow the movement of the shaft during the sweeping process, where the nozzle will be sliding from the beginning of the article to be cleaned until the end of that article. The opening from where the shaft enters the vacuum chamber preferably is equipped with multiple O-rings and plates to prevent loss of vacuum from the chamber and maintain high vacuum level inside the chamber.

Alternatively, in yet other preferred embodiments of the present invention, the track and drive motor are located outside the vacuum chamber and attached to a magnetic coupling system. In accordance with such embodiments, the cryogenic spray assembly is enclosed inside the cryogenic vacuum chamber and the chamber has a partition wall with a slot through which the cryogenic spray nozzle extends. The magnetic coupling system preferably slides on the track for the length of the article to be cleaned driven by the motor, while magnetically coupling the cryogenic spray nozzle on the inside of the vacuum chamber to allow the cryogenic spraying nozzle to sweep the length of the article to be cleaned from beginning to end.

BRIEF DESCRIPTION OF THE DRAWINGS

The present invention may be more fully understood by a description of certain preferred embodiments in conjunction with the attached drawings in which.

DETAILED DESCRIPTION OF THE PREFERRED EMBODIMENTS

Figure 1:
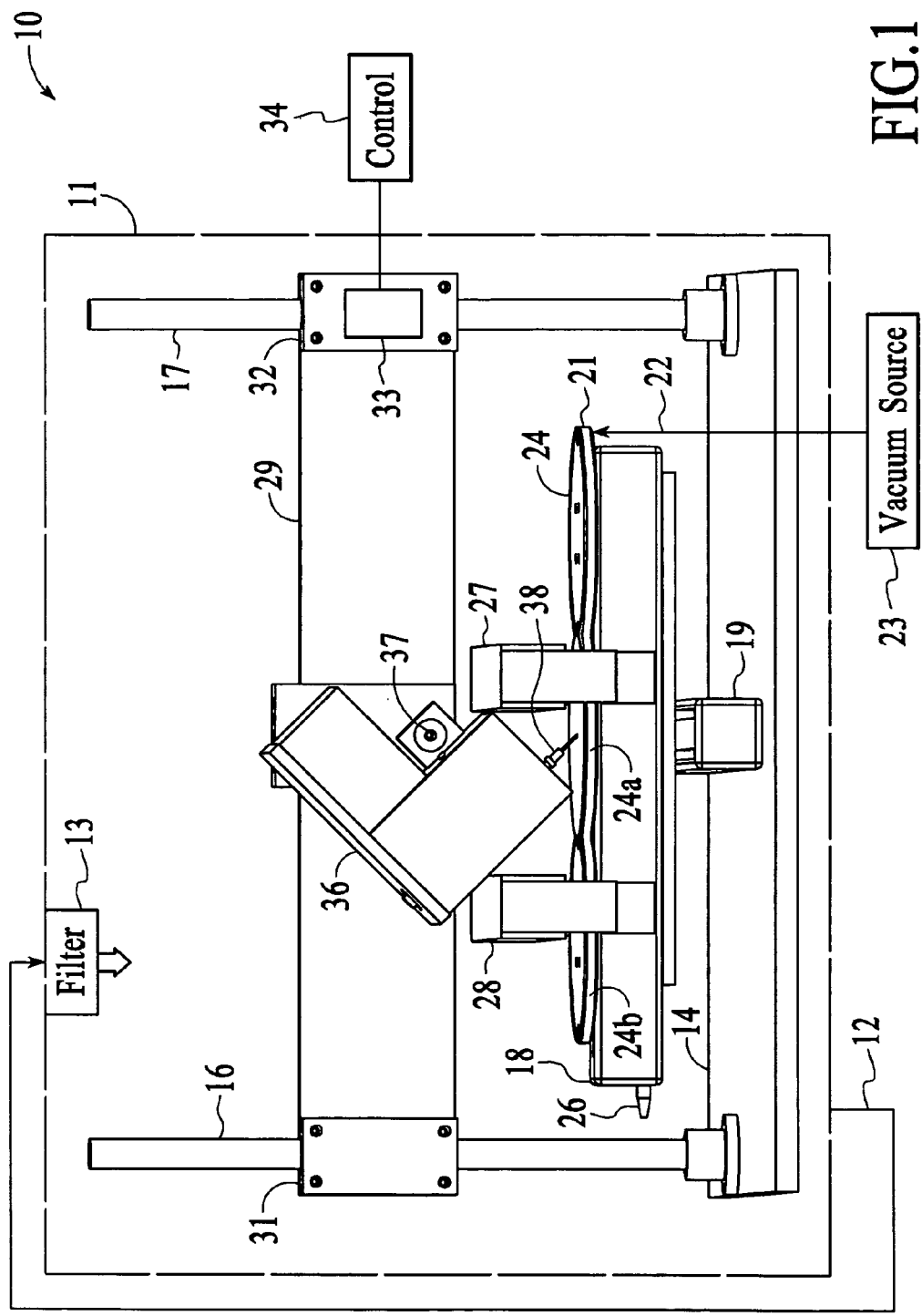
FIG. 1 is a perspective showing one embodiment of the system of the present invention.

The present invention will be described in greater detail with reference to certain preferred embodiments and certain other embodiments, which may serve to further the understanding of preferred embodiments of the present invention. As described elsewhere herein, various refinements and substitutions of the various embodiments are possible based on the principles and teachings herein.

The present invention generally is related to the following U.S. patents/applications that are assigned to the assignee of the present invention: METHODS FOR CLEANING SURFACES SUBSTANTIALLY FREE OF CONTAMINANTS, application Ser. No. 09/636,265, file on Aug. 10, 2000, now U.S. Pat. No. 6,530,823; APPARATUS FOR CLEANING SURFACES SUBSTANTIALLY FREE OF CONTAMINANTS, application Ser. No. 09/637,333, also filed on Aug. 10, 2000, now U.S. Pat. No. 6,543,462; and METHODS FOR CLEANING SURFACES SUBSTANTIALLY FREE OF CONTAMINANTS UTILIZING FILTERED CARBON DIOXIDE, application Ser. No. 10/359,806, now U.S. Pat. No. 6,719,613 and a continuation thereof filed as application Ser. No. 10/819,619 (collectively, "the First Referenced Applications"). The present invention also is related to the following commonly assigned U.S. patent and application: METHODS FOR RESIST STRIPPING AND CLEANING SURFACES SUBSTANTIALLY FREE OF CONTAMINANTS, filed on Jul. 29, 2002, now U.S. Pat. No. 6,764,385, and a continuation thereof filed as application Ser. No. 10/894,626 (collectively, "the Second Referenced Applications"). The First Referenced Applications more generally disclosed methods and systems for cryogenically (preferably using carbon dioxide) cleaning articles or surfaces substantially free from contaminants, preferably using an oscillatory nozzle assembly for the cryogenic cleaning medium. The Second Referenced Applications more generally disclose methods and systems for combining remotely generated plasma and/or an RF plasma and oscillating cryogenic nozzle system (preferably using carbon dioxide) for the removal of photoresist or similar layer and cleaning the residues left an the articles. As the present invention, in at least certain preferred embodiments, also utilizes an oscillatory or vibratory type nozzle assembly for a cryogenic cleaning medium (preferably in combination with a remotely-generated plasma and/or an RF plasma utilized preferably for removal of a photoresist or similar layer), certain disclosure from the First and Second Referenced Applications will be set forth herein. The First and Second Referenced Applications are hereby incorporated by reference. It is further noted that embodiments of the presently disclosed invention may be desirably utilized in the methods disclosed in application Ser. No. 11/045,684 filed on even date herewith and entitled METHODS FOR RESIDUE REMOVAL AND CORROSION PREVENTION IN A POST-METAL ETCH PROCESS, which also is hereby incorporated by reference.

The present invention, however, preferably utilizes such an oscillatory, vibratory and/or pulsating cryogenic cleaning assembly in combination with a plasma process preferably in a single vacuum chamber; in alternative embodiments, the plasma process and the cryogenic process are in separate vacuum chambers preferably adjacent to each other in the same processing tool. The cryogenic cleaning implement preferably is provided in combination with the plasma process, where the oscillatory, vibratory or pulsating aspect of the cryogenic cleaning assembly is optionally provided (i.e., in such embodiments, the cryogenic cleaning medium may or may not be provided with oscillatory, vibratory or pulsating action, etc.).

Very small quantities of contamination generally are detrimental to the fabrication processes involved in producing integrated circuit wafers, hard discs, optical elements, etc. Contamination in the form of particulates, films, or microscopic clusters of molecules can produce fatal defects in any of the aforementioned products before, during or after fabrication processes. Cleanliness with elevated temperature processes is extremely important due to the typical increase in the reaction rate of impurities with an increase in temperature. At high temperature it is possible for the impurities to diffuse into the silicon or mix with dielectric or conductors to cause unexpected and unwanted electrical or other characteristics. This tends to cause device failure, degraded reliability, and/or operational failure. Cleaning of the surfaces of such products is therefore essential at various phases during fabrication.

The use of plasma chemistry has become very important in the semiconductor manufacturing sector. In photoresist stripping, the plasma used in a dry process typically is performed using free radicals. This process is usually enhanced by a physical means to improve material removal and cleaning efficiency, often using an ion bombardment process. There are many shortcomings of the aforementioned combination, such as the conflict of the relatively high pressure requirement for the effectiveness of the pure chemical stripping and the ion bombardment processes that require low pressure to increase the ions mean free path. Another problem with the ion bombardment process is that charging damage could occur and cause wafer defects.

In accordance with preferred embodiments of the present invention, a plasma process is provided in conjunction with cryogenic cleaning for the physical removal of contamination. In accordance with the present invention, such an approach tends to eliminate the pressure conflict described elsewhere herein and tends to drastically reduce the charging damage problem. Without being bound by theory, this is believed to be due to the pressure upstream of the nozzle not being very critical in the cryogenic expansion. In addition, in accordance with the present invention, the process preferably is regulated for maximum efficiency by controlling the upstream pressure, velocity, temperature, and the frequency and the amplitude of the nozzle vibration or oscillation or nozzle flow pulsation.

Cryogenic cleaning of surfaces utilizing impingement of solid particles of relatively inert gases such as argon and $CO_2$ are known and the manner in which solid particles of such gases are generated for cleaning purposes need not be described herein. Without being bound by theory, in such cases it is thought that the combination of sublimation of the solid particles as they impinge the surface to be cleaned as well as the impact momentum transfer by the particles provide the vehicle for removing contamination from a surface. It is further recognized that sublimation occurs, and therefore a major portion of the cleaning, only while the surface to be cleaned is at a higher temperature than that of the cryogenic spray. The thermophoresis due to the heated surface also helps to remove the particles from the surface and reduce the chance for re-deposition of the detached particles. As a consequence, heating of the surface being cleaned preferably is required within the vicinity of the impinging cleaning spray. In addition to the thermophoresis effect, heating the article to be cleaned generally tends to cause some of the cryogenic fluid to melt and then evaporate instead of sublimate, hence tending to result in the presence of liquid phase cryogenic along with the gas and solid phases on the surface of the article. The presence of the three phases generally occurs in a non-equilibrium fashion. The presence of the liquid phase is important in creating a solvent property that will aid in removing contaminants from the surface of the article.

In accordance with preferred embodiments of the present invention, heating for the cryogenic cleaning is optional. Another important aspect of single chamber processes with the combination of plasma and cryogenic cleaning is the elimination of contamination that in certain situations tends to be deposited on the wafer with cryogenic cleaning alone. Without being bound by theory, the sources of the contaminants are believed the delivery system and impurities that exist in the cryogenic cleaning medium; those impurities are believed to be composed of fluorinated and other hydrocarbons. The fact that the plasma gases are used to clean fluorinated hydrocarbons could eliminate this problem In certain preferred embodiments, a purification system is provided to remove particles and other contaminants such as hydrocarbons for use in the systems and methods of the present invention. In another embodiment, cleaning by various other solvents and solvent combinations where the levels of residual contaminants following the cleaning process need not be held quite as low, is also envisioned for use in the systems and methods of the present invention.

As previously explained, certain disclosure from the First and Second Referenced Applications will now be provided so that an exemplary, preferred oscillatory cryogenic cleaning assembly and method might be understood.

Reference is now made to FIG. 1 of the drawings, wherein one exemplary embodiment of the present invention is illustrated. A system 10 is shown in FIG. 1 having an enclosure 11 depicted in phantom line. The environment within the enclosure is maintained at a level of cleanliness depending on the level of cleanliness to be imposed on articles to be cleaned within the enclosure. A scavenging line 12 is shown exiting the enclosure 11 at the bottom thereof and proceeding to a filter 13 for removing particulates from the enclosure environment that may be generated by the cleaning process or by mechanical components within the enclosure. Rudimentary support structure is shown including a base plate 14 and two uprights 16 and 17 attached at their bases to the base plate. The description herein makes reference to an XYZ coordinate system, wherein the Z direction is substantially vertical and the mutually orthogonal Z and Y axes are substantially horizontal. An XY stage is shown having an X stage 18 for movement on a Y stage 19, that is mounted on the base plate 14 (other X/Y stage configurations are within the scope of the present invention). A holding chuck 21, in this instance a vacuum chuck connected through a line 22 to a vacuum source 23, is mounted for movement on the X stage 18. An article to be cleaned, in this exemplary illustration an integrated circuit wafer 24, is shown in FIG. 1 mounted to the vacuum chuck 21 and held in place by known means (e.g., held in place by the vacuum). FIG. 1 shows the integrated circuit wafer 24 in an initial position, and subsequently in a cleaning position at 24a and a post-heating position at 24b. The integrated circuit wafer 24 preferably is transportable along a predetermined path governed by the movement of the X stage 18 on the Y stage 19 and the movement of the vacuum chuck 21 on the X stage 18. Chuck 21 is driven over the upper surface of the X stage by known means, which may include a carriage portion within the X stage driven by a lead screw and a servo motor (not shown), for example. A cable connection 26 is shown at one end of the X stage for introducing power to energize the aforementioned servo motor. A similar cable connection (not shown) is provided to power the Y stage 19 so that the X stage, mounted on a moveable carriage of the Y stage, may be moved in the Y direction by a lead screw and servo motor similar to that mentioned hereinbefore in conjunction with the X stage.

From the foregoing it is seen that the integrated circuit wafer 24 shown in an initial position in FIG. 1 may be moved to the left in FIG. 1 to pass beneath a pre-heater 27 at a pre-heat position along the aforementioned predetermined path, which preferably pre-heats the integrated circuit wafer prior to cleaning. Further movement of the chuck 21 brings the integrated circuit wafer to a cleaning position indicated in FIG. 1 at 24a. Continuing movement of the chuck along the predetermined path defined by the X and Y stages 18 and 19 delivers the integrated circuit wafer to a post-heat position shown at 24b, wherein post-heating of the integrated circuit wafer preferably is performed by a post-heater 28. The pre and post heaters may be infrared lamps or other heating sources. These heaters preferably impart surface temperatures to the article that enhance cleaning, prevent re-contamination and remove static electricity. In alternative embodiments, the pre and post heaters are supplemented with, or replaced by, a heated vacuum chuck, with the heated vacuum chuck providing heat to the article to be cleaned, etc. The use of such a heated vacuum chuck also may be used in accordance with other embodiments of the present invention as described herein.

A nozzle assembly support plate 29 is shown extending between the two uprights 16 and 17. The support plate preferably is attached at the upright 16 in a Z position by a friction clamp 31. The support plate 29 preferably is mounted on the opposing end to upright 17 in the Z position by an additional friction clamp 32. It should be noted that the position of the mounting plate 29 in the Z direction may be governed by a servo motor 33 and associated mechanism (not shown) similar to that of the X and Y stages, so that the Z position of the support plate 29 is dictated by a control 34, which may controllably raise or lower the support plate 29 either before, during or after cleaning or other processing.

A spray nozzle assembly 36 is shown mounted to the support plate 29 at a pivot 37. A nozzle 38 is shown extending from the spray nozzle assembly 36 at a lower portion thereof at the cleaning position shown by the position of integrated circuit wafer 24a in FIG. 1. A preferred exemplary angle of the nozzle 38 to the surface to be cleaned on the integrated circuit wafer 24 is seen in FIG. 1 to be obtuse to the direction of approach of the integrated circuit wafer. Expressed alternatively, the angle of the nozzle 38, and the subsequent spray emitted therefrom, is acute to the downstream portion of the predetermined path along which the wafer travels on the XY stage. The point to be made here is that the spray emanating from the spray nozzle 38 preferably is set to impinge the surface to be cleaned at an angle to facilitate contaminant removal and to add any velocity of the surface to be cleaned to the spray velocity for purposes of enhancing contaminant removal. That angle of impingement as seen in FIG. 1 preferably is adjustable by moving the spray nozzle assembly 36 rotationally about the pivot 37 and fixing the angle in the adjusted position.

It should also be noted that, in preferred embodiments, one or more jets for cleaning an article, with the oscillatory-type movement of the present invention, such jets, although having a non-uniform spray pattern, may result in a more substantially uniform and improved spray distribution due to the oscillatory-type movement, which preferably enables an article to be more uniformly cleaned in a single pass, etc.

Figure 2:
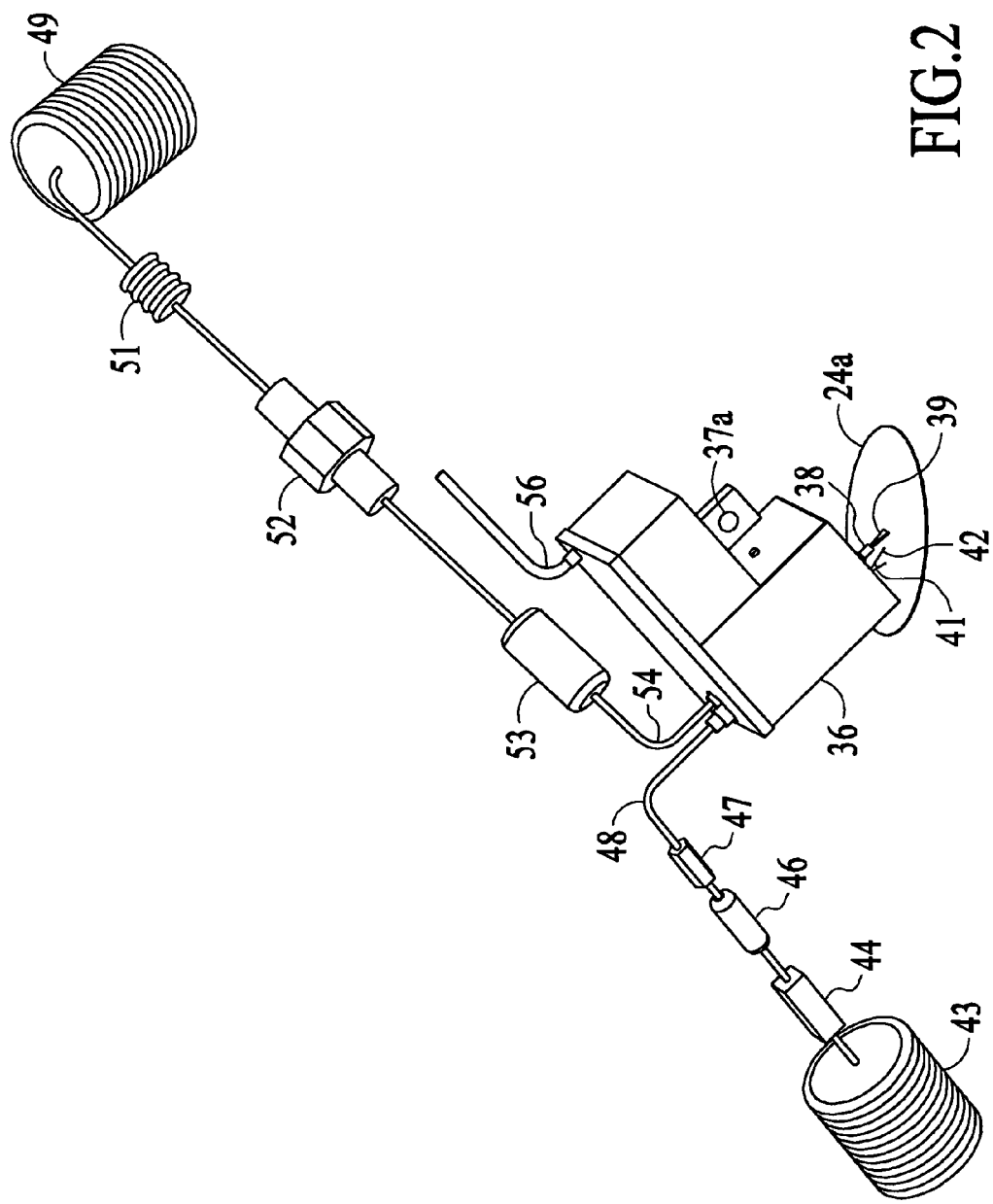
FIG. 2 is a schematic showing gas and vacuum paths for one embodiment of the system of the present invention.

Turning to the diagram of FIG. 2, the spray nozzle assembly 36 is shown poised in position above the integrated circuit wafer in the position represented by 24a wherein the wafer is moving to the left in FIG. 2 relative to the spray nozzle assembly. Nozzle 38 is shown directing a cleaning spray 39 onto the surface of the article to be cleaned (integrated circuit wafer 24a in FIG. 2) at the spray impingement angle referred to hereinbefore in conjunction with FIG. 1. A second spray nozzle 41 is shown just visible in the diagram of FIG. 2 for preferably delivering a heated inert gas spray 42 for heating, drying and removing static electricity from the surface just cleaned by the spray 39. The heated inert gas spray nozzle 41 may fill the requirements of the post-heater 28 shown in FIG. 1. Details of construction of the nozzles 38 and 41 will be described in more detail hereinafter.

FIG. 2 shows an inert gas source 43 connected through a flow line to a temperature control module 44 and subsequently to a gas filter 46. Inert gas flow is subsequently directed through an ionizer 47 and a flexible line 48 to the nozzle 41 contained in the spray nozzle assembly 36. A cleaning medium container 49 (such as an argon or $CO_2$ gas container) preferably is connected through a gas flow line to a temperature control 51. The temperature controlled cleaning medium preferably is connected to a pressure booster 52 and subsequently to a filter 53 for removing contaminants. The filtered, temperature controlled and pressurized cleaning medium preferably is connected through a flexible line 54 to the nozzle 38 in the spray nozzle assembly 36. The manner in which a gas cleaning medium is conditioned for cryogenic cleaning is known, and teachings from the art submitted contemporaneously herewith are incorporated herein by reference. In certain applications the cleaning medium contained in the container 49 may be a solvent different from the cryogenic gas, known to those in this art, descriptions of which will not be undertaken here. A flexible vacuum line 56 is shown in FIG. 2 to remove contaminants generated by functions taking place within the case of the spray nozzle assembly 36 so that they are not deposited upon the surface to be cleaned. The flexible vacuum line 56 is led to the outside of the enclosure 11 when the system containing the spray nozzle assembly 36 is enclosed therein. The location of the pivot 37 of FIG. 1 is shown by the hole 37a depicted in FIG. 2.

Figure 3:
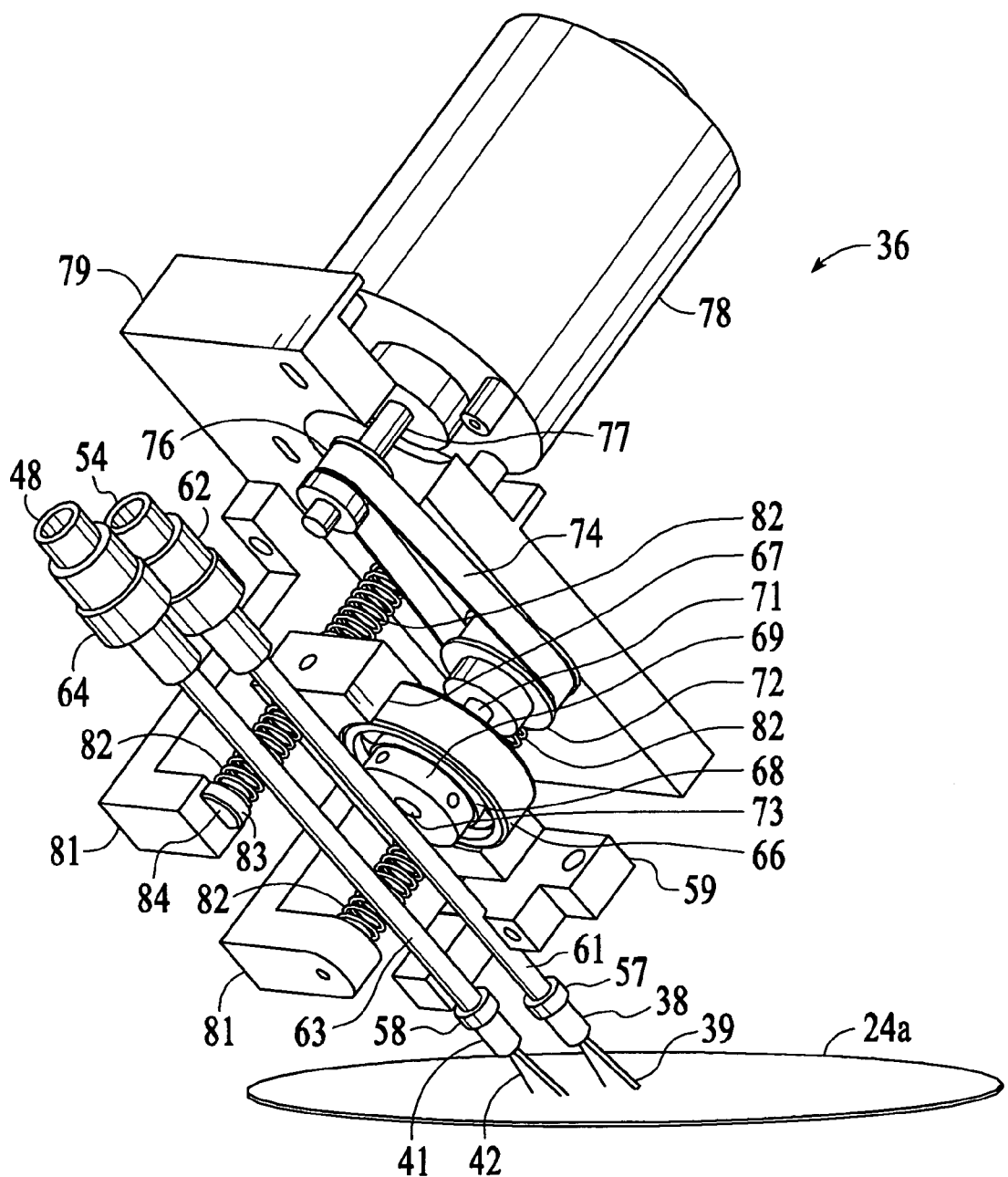
FIG. 3 is a perspective of one embodiment of the spray nozzle assembly of the present invention with the outer cover removed.

FIG. 3 depicts the spray nozzle assembly 36 with the cover removed. The article to be cleaned represented by the integrated circuit wafer 24a is seen to be moving to the left in FIG. 3 relative to the spray nozzle assembly. The spray nozzle assembly is pivoted about the pivot 37 (FIG. 1) to assume the position shown in FIG. 3 so that the cleaning nozzle 38 dispenses the cleaning spray 39 at an obtuse angle relative to the approaching portion of the surface to be cleaned. The cleaning nozzle 38 preferably has a nozzle axis and a nozzle tip with an elongated nozzle opening therein to provide the exemplary preferred fan-shaped spray 39 seen in FIG. 3. A friction lock 57 is shown on the nozzle 38 which allows the tip of the nozzle to be rotated around the nozzle axis and to be locked in the rotated position. Rotation of the tip of nozzle 38 preferably allows the fan-shaped spray 39 to impinge the surface to be cleaned at an angle of rotation about the nozzle axis. This angle of rotation allows the fan-shaped spray 39 to push contaminates to one side of the surface to be cleaned as to the spray nozzle is oscillated to thereby affect a "snow plow" function. This will be further explained in conjunction with the description of the oscillation of the nozzle 38. In like fashion, nozzle 41 for dispensing inert drying gas, preferably has a friction lock 58 functioning in the same manner as the friction lock 57 on nozzle 38. Nozzle 41 also has a tip with an elongated opening therein for preferably producing a fan shaped emission of inert drying gas 42. Nozzle 38 preferably is attached to a nozzle mounting block 59 through a tube 61 and a connector 62 coupling the nozzle 38 to the flexible line 54 (FIG. 2). Nozzle 41 also preferably has a tube 63 connected thereto which is mounted in the nozzle mounting block 59. A connector 64 connects the tube 63 to the flexible line 48 (FIG. 2) to deliver heated inert gas to the surface to be cleaned immediately after cleaning when that method is used for post-heating and removal of static charge from the surface being cleaned.

Nozzle mounting block 59 in FIG. 3 is cut away to show installation of the outer diameter of an outer bearing race 66 mounted within a bore 67 in the nozzle mounting block. An inner race 68 on the bearing within the bore 67 has an eccentric cam-member 69 mounted therein. A shaft 71 on a pulley 72 is passed through an offset hole 73 in the eccentric cam and fixed therein. The pulley 72 is driven by a belt 74 which in turn is driven by a pulley 76 mounted on the end of a shaft 77 driven by a motor 78. The motor 78 is mounted in a motor mount block 79 (partly cut away for clarity) secured to the outer case of the spray nozzle assembly 36. The motor mount block 79 also serves to mount the pulley 72 for rotation thereon. A plurality of arms 81, two of which are shown in FIG. 3, are fastened to the motor mounting block 79 extending outwardly therefrom to a position beyond the nozzle mounting block 59. Yieldable structure such as coil springs 82, extend from the ends of the arms 81 to the nozzle mounting block 59 and from the motor mounting block 79 to the opposing side of the nozzle mounting block 59. The ends of the coil springs 82 are encompassed by buttons or caps 83 that are seated in counter bores in the structural members 59, 79 and 81 that receive respective ends of the coil springs 82. The material for the end caps 83 is preferably Delrin AF. Very little particulate is sloughed off of the Delrin AF surfaces when the material is subjected to friction. As a result, the springs 82 are anchored on one end within the bores 84 at the ends of the arms 81 and in the motor mounting block 79 and anchored at an opposing end within bores 84 in the nozzle mounting block 59. Nozzle mounting block 59 is therefore suspended by the springs 82 in position spaced from the remainder of the spray nozzle assembly. Consequently, when the spray nozzles 38 and 41 are mounted on the nozzle mounting block 59, and when the nozzle mounting block is moved, the sprays 39 and 42 are moved relative to the surface to be cleaned on the integrated circuit wafer 24a in FIG. 3. An optimum offset from the geometric center of the offset cam 69 has been found to be about 0.075 inches. As a result an optimum peak to peak amplitude for cam excursion is about 0.150 inches. An optimum cam rotation frequency through the pulleys 76 and 72 has been found to be approximately 27.5 revolutions per second or about 27½ Hertz. Thus, in a preferred embodiment, the optimum amplitude provided by the cam 69 falls within the range of about 0.120 to 0.180 inches peak to peak. The optimum frequency falls within the range of about 25 to 30 Hertz. Other amplitudes and frequencies for optimum cleaning of specific contaminants from surfaces are envisioned as within the scope of the present invention.

Springs 82, in this preferred embodiment, preferably have coils of 0.043 inch diameter stainless steel wire, with one half (½) inch diameter coils and lengths of one and one-half (1½) inches. Such springs generally should provide adequately support the mass of the nozzle mounting block 59 and members attached thereto. It should further be noted that motor 78 could be mounted on motor mounting block 79 to directly drive shaft 71 connected to the eccentric cam 69 in those instances where the rotational output speed of the motor shaft 77 imparts an acceptable frequency to the oscillatory motion induced by the rotation of the eccentric cam 69. In any event, the nozzle mounting block 59 and the nozzles 38 and 41 attached thereto are driven at a predetermined frequency and amplitude, so that the nozzles are driven in a circular pattern having a diameter of the peak to peak oscillation amplitude and a frequency determined by the rotational frequency of the eccentric cam 69. The physical dimensions of springs 82 will depend on the mass of the spray nozzle assembly 36. Therefore, heavier or lighter springs 82 may be used as the spray nozzle assembly assumes greater or lesser mass. It is noted that the preferred structure for imparting the cyclic motion to the nozzles 38 and 41 relative to the surface to be cleaned are exemplary.

Figure 4:
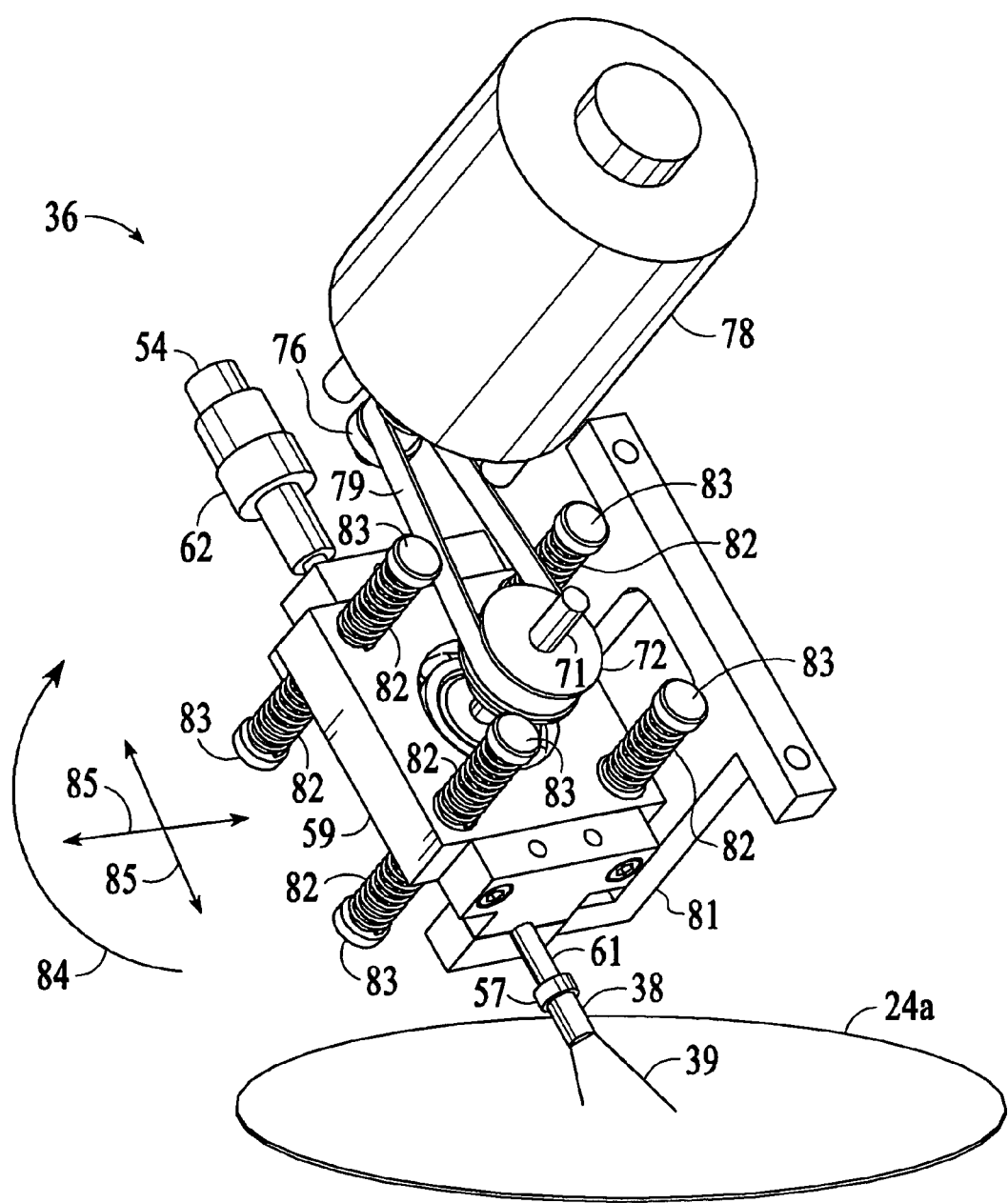
FIG. 4 is a perspective of another embodiment of the nozzle assembly of the present invention with the outer cover removed.

FIG. 4 depicts the spray nozzle assembly 36 with the motor mounting block 79 removed from the drawing for clarity. As seen in FIG. 4, a single nozzle 38 is shown having the aforementioned preferred elongated aperture therein for providing emission of the fan-shaped spray 39 for impingement on the surface to be cleaned. The surface shown in FIG. 4 is the surface of the integrated circuit wafer 24a Friction lock 57 in the illustration of FIG. 4 is loosened and the nozzle 38 is rotated counter-clockwise (looking at the elongated aperture therein). The orientation of the aperture of nozzle 38 is locked in the adjusted position by the friction lock 57. When the motor 78 is energized and an oscillation in the nozzle 38 is imparted by the oscillation of the nozzle mounting block 59 on the support provided by the springs 82, the nozzle tip, and therefore the spray 39 describes a circular pattern at the predetermined amplitude and frequency. The rotation of the oscillation is indicated by the arrow 84 in FIG. 4.

The impingement of the spray pattern 39 on the surface to be cleaned is illustrated in FIG. 4. The nozzle 38 and the spray pattern 39 moves during half of each rotational cycle toward the integrated circuit wafer. Further, during the subsequent half of each rotational cycle the nozzle and spray move away from the wafer surface. This is seen when it is recognized that the nozzle tip describes a circle during oscillation, wherein the plane of the circle substantially includes an extension of the nozzle axis. This is illustrated in FIG. 4 by the rotational arrow 84 and the arrows 85 representing oscillation circle diameters. The nozzle 38 sweeps the spray 39 side to side on the wafer surface because the edge of the circle represented by diameters 85 appears as a straight line when viewed from the wafer surface.

Now considering the rotation of the flat fan shaped spray 39 about the nozzle axis by the adjustment of the friction lock 57, the fan 39 impinges the surface at a compound angle (displaced from the side to side sweep) preferably resulting in the "snow plow" effect of the fan-shaped spray 39 during half of each cycle as it rotates in the direction of the arrow 84. Further, the disclosed oscillation of the fan-shaped spray 39 provides the benefits of pulsing which enhances cleaning. Pulsing in the past has been provided in a spray by interrupting the spray periodically. However, such interruption causes the spray jet to lose optimum characteristics as the spray is cut off and restarted when the spray is a cryogenic cleaning medium comprised of solid gas particles. The pulsing occurs in the embodiments disclosed herein due to increasing velocity (or acceleration) as the spray 39 converges on the surface to be cleaned during one half (½) of the oscillatory cycle and the decrease in velocity (negative acceleration) as the spray 39 diverges from the surface to be cleaned during the other half of the oscillatory cycle. Spray nozzle 38 describing a circular pattern during oscillation as described hereinbefore, preferably lays down a laterally oscillating spray pattern on the surface to be cleaned. The angle of the spray pattern impingement on the surface is therefore formed by adjustment of the spray nozzle assembly 36 rotationally about the pivot 37 (FIG. 1) and adjustment to the spray fan orientation about the nozzle axis through adjustment of the friction lock 57. Pulsing and compound angle "snow plow" effects in cleaning are believed to provide advantages in obtaining thorough contaminant removal. It should be mentioned that the shaft 71 for driving the eccentric cam 69 (FIG. 3) could be driven directly by the motor 78, allowing elimination of the pulleys 72 and 76 and the belt 74 as discussed in conjunction with FIG. 3. On the other hand, selection of relative diameters of pulleys 72 and 76 may be used to adjust the frequency of oscillation if desired.

Figure 5:
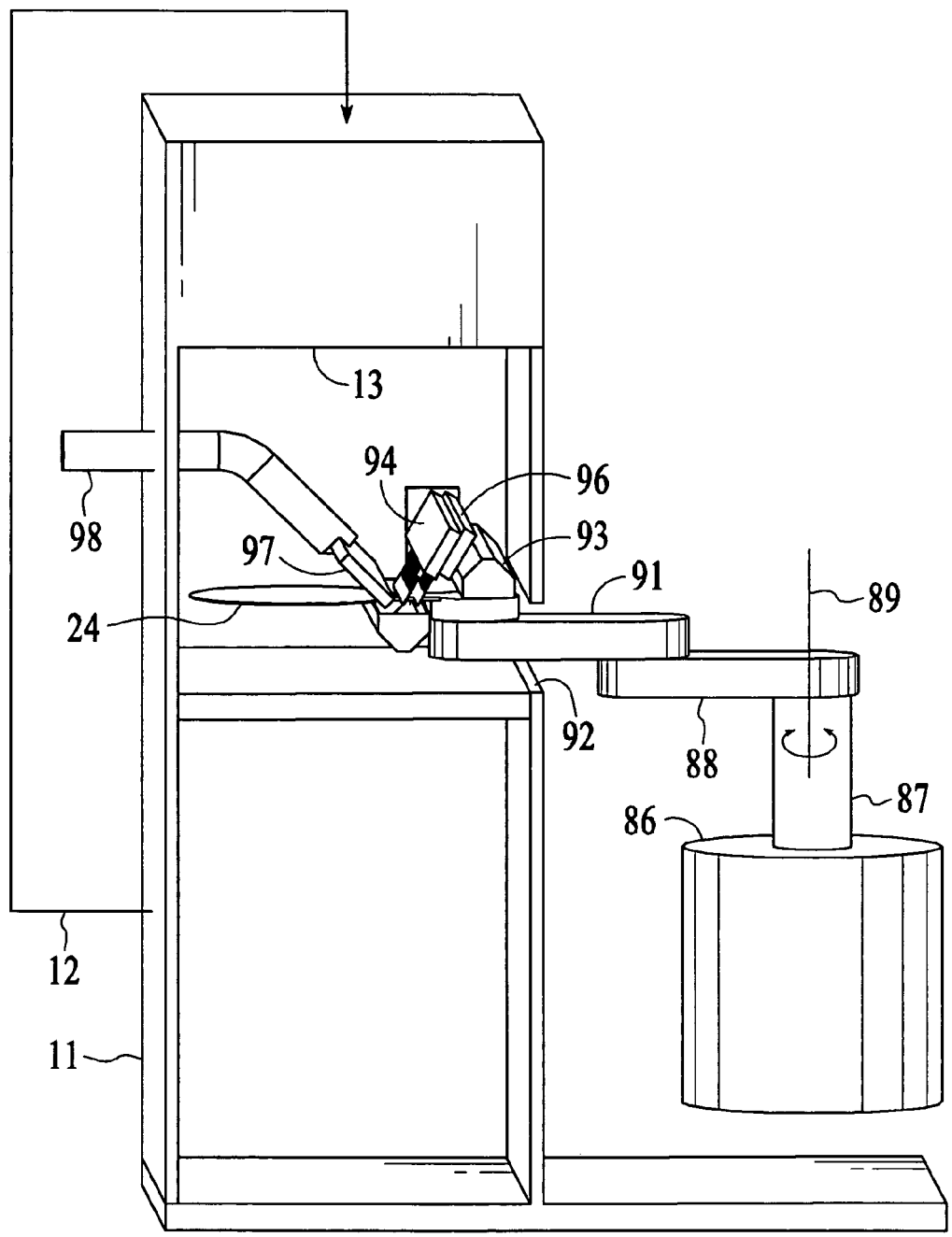
FIG. 5 is a perspective of an additional embodiment of the system of the present invention.

The embodiment of FIG. 5 depicts a robot 86 having an extendable and retractable arm 87, providing movement in a vertical direction, and a laterally extending arm segment 88 disposed for rotation about an axis 89 at the upper end of the arm 87. An additional robot arm 91 is provided that moves translationally in a horizontal direction. Translationally moving arm 91 extends through an egress/ingress port 92 in the enclosure 11 of FIG. 5 to insert an article having a surface to be cleaned, such as the integrated circuit wafer 24, into a controlled environment within the enclosure 11 as discussed in conjunction with the enclosure 11 of FIG. 1. The wafer 24 is shown at the limit of its insertion within the enclosure 11, having passed the pre-heater and post-heater combination 93 immediately inside the ingress/egress port. Wafer 24 is therefore pre-heated at the position shown in FIG. 5 and then withdrawn toward the ingress/egress port 92 to pass beneath a bank (plurality) of cleaning nozzles 94. The bank of nozzles extend across the entire dimension of the wafer, providing impingement by a plurality of fan shaped sprays on the surface to be cleaned, thereby cleaning the surface in a single pass beneath the bank of cleaning nozzles 94. Immediately following passage of the surface to be cleaned beneath the cleaning nozzles 94, an inert drying gas and anti-static electricity array 96 is positioned that also extends across the entire dimension of the wafer 24. As the wafer is withdrawn toward the ingress/egress port 92, the surface is dried by the inert drying gas nozzle array and further heated by the pre/post heater 93 to a temperature that will prohibit condensation on the clean surface as it is withdrawn from the enclosure 11 by the robot arm 91. Positioned adjacent the cleaning nozzle array 94 is a scavenging intake 97 that operates to remove particulates cleaned from the surface of the wafer 94 as well as particulates generated within the enclosure 11. Scavenging intake is connected to an exhaust 98, which carries the contaminants from within the enclosure to the ambient environment. Pressure within the enclosure 11 preferably is maintained slightly higher than ambient pressure to prevent contaminants from entering the enclosure through the ingress/egress port 92. Further, as in the description of the embodiment of FIG. 1, the scavenging line 12 is provided to withdraw the enclosed atmosphere and deliver it to the cleaning filter 13 to further reduce contaminants within the enclosure.

Figures 6, 7:
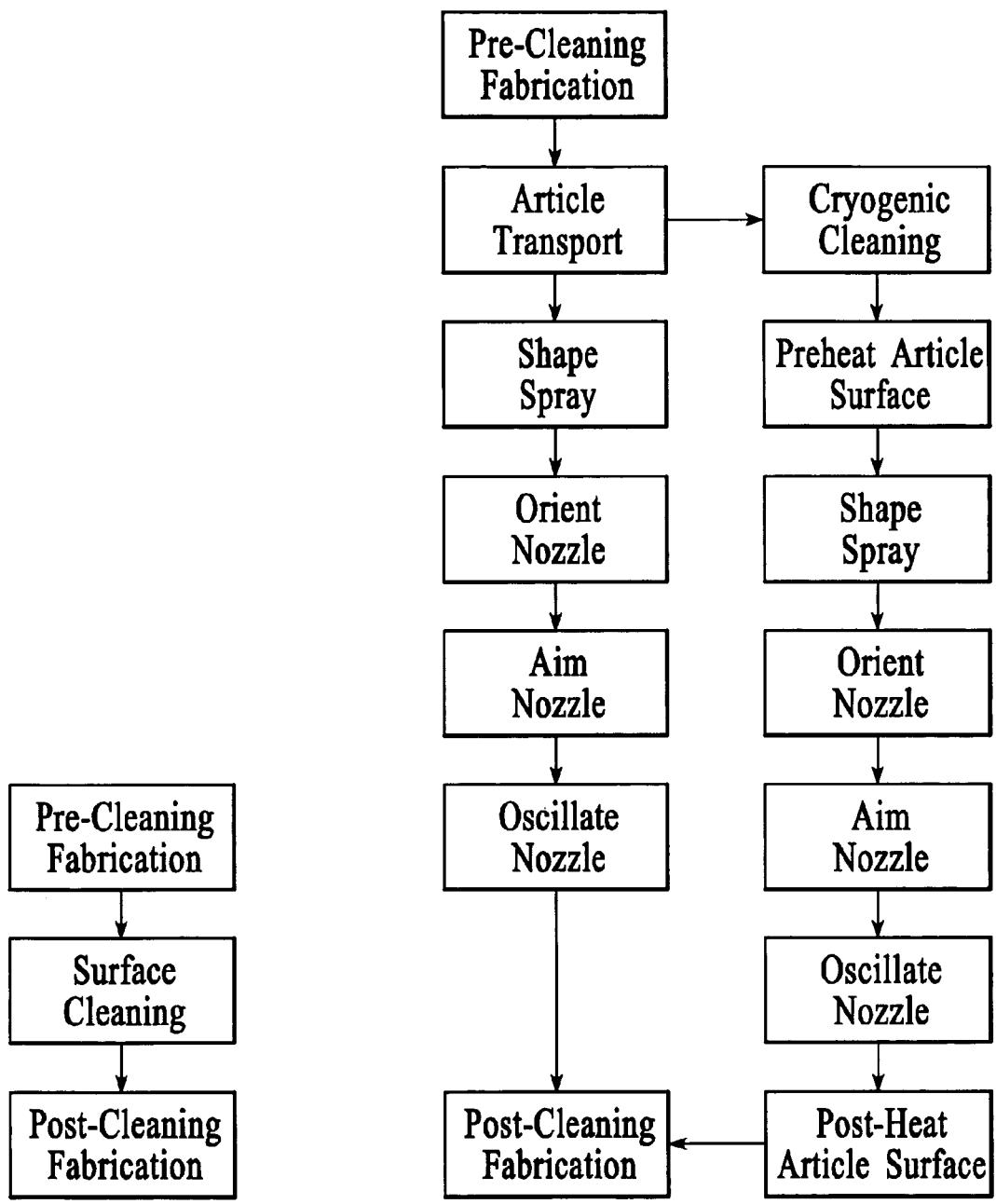
FIG. 6 is a block diagram relating to the process of the present invention.
FIG. 7 is another block diagram illustrating the details of the process of the present invention.

With regard to an exemplary preferred method in accordance with the present invention, there preferably exist certain pre-cleaning fabrication steps for the article having a surface to be cleaned followed by the step of cleaning the surface, and culminating in post-cleaning fabrication steps for the article having a surface to be cleaned. The block diagram of FIG. 6 depicts these steps. Details of a preferred surface cleaning process of FIG. 6 are found in the block diagram of FIG. 7. FIG. 7 illustrates the pre-cleaning fabrication steps of FIG. 6 followed by mounting the article having a surface to be cleaned on an article transport. In one embodiment of the cleaning process the article is transported to a cleaning position and the shape of the spray is configured to assume a fan shape. The spray nozzle in then oriented to cause the spray to impinge the surface to be cleaned at an angle to the lateral dimension of the surface as it passes the spray. This angle is called a compound angle. The nozzle is then aimed at the surface to be cleaned to form an obtuse angle with the surface relative to the approaching portion of the surface to be cleaned. Subsequently, the nozzle is oscillated so that the spray functions as a pulsing spray as the forward motion of the nozzle is added to the velocity of the cleaning spray during one portion of the oscillation cycle and is subtracted from the velocity of the cleaning spray during the subsequent portion of the oscillation cycle. Moreover, the orientation of the nozzle aperture and the fan-shaped spray about the nozzle axis preferably provides a "snow plow" effect facilitating cleaning as previously described. Subsequent to the cleaning by the oscillating fan-shaped spray the article preferably is moved onto the post-cleaning fabrication steps as illustrated in FIG. 7.

In another aspect of the cleaning process of the present invention a cryogenic cleaning medium is used. As mentioned hereinbefore an inert gas such as argon or $CO_2$ is in substantially solid or "snow" form as it is emitted from the nozzle so that sublimation of the gas occurs at the surface to be cleaned. In this process the surface to be cleaned preferably is preheated to a temperature such that the surface to be cleaned will remain at a temperature above ambient during the impingement of the cryogenic spray on the surface. The spray preferably is shaped into a fan shape and the spray nozzle aperture preferably is oriented about the nozzle access to provide impingement of the fan spray on the surface to be cleaned at an angle to the lateral dimension of the surface (the compound angle). The spray nozzle preferably is then aimed at the surface at an obtuse angle relative to the surface portion approaching the cleaning spray and the nozzle preferably is oscillated in a cyclic pattern having a pre-determined amplitude and frequency. The nozzle preferably oscillates in a substantially circular pattern in a plane including the nozzle axis so that the spray pattern is lateral and linear on the surface. Moreover, due to the orientation of the nozzle rotationally about the nozzle axis, the spray impinges the surface at the compound angle and performs a "snow plow" function. This function is believed to tend to push contaminants to one side of the surface to be cleaned. Following exposure to the oscillation cleaning spray, the surface preferably is post-heated to a temperature above ambient temperature to prevent condensation and recontamination of the surface and also to remove static charge. It should be noted that the step of shaping the spray preferably reside in both embodiments of the process described in conjunction with FIG. 7 and includes expanding the width of the cleaning spray to cover the lateral dimension of the surface to be cleaned. As a result, the cleaning of the surface may be obtained in a single pass of the surface to be cleaned past the spray. Subsequently the post-heated article surface is passed to the post-cleaning fabrication steps as seen in FIG. 7.

As previously explained, preferred embodiments of the present invention are directed to the combination of plasma processing (such as removal or ashing of a photoresist-type layer) that provides a chemical mechanism, followed by a cryogenic cleaning processing that preferably provides a physical removal-type mechanism. While oscillatory or vibratory-type cryogenic cleaning is believed to provide more optimum results in certain embodiments, the present invention as set forth herein is expressly not limited to the use of oscillatory or vibratory type cryogenic cleaning, and certain embodiments of the present invention utilize cryogenic cleaning that is not oscillatory or vibratory. Accordingly, the foregoing description from the First Referenced Applications is provided as background and for providing a description of an exemplary oscillatory assembly used only in certain embodiments of the present invention.

Figure 8A:
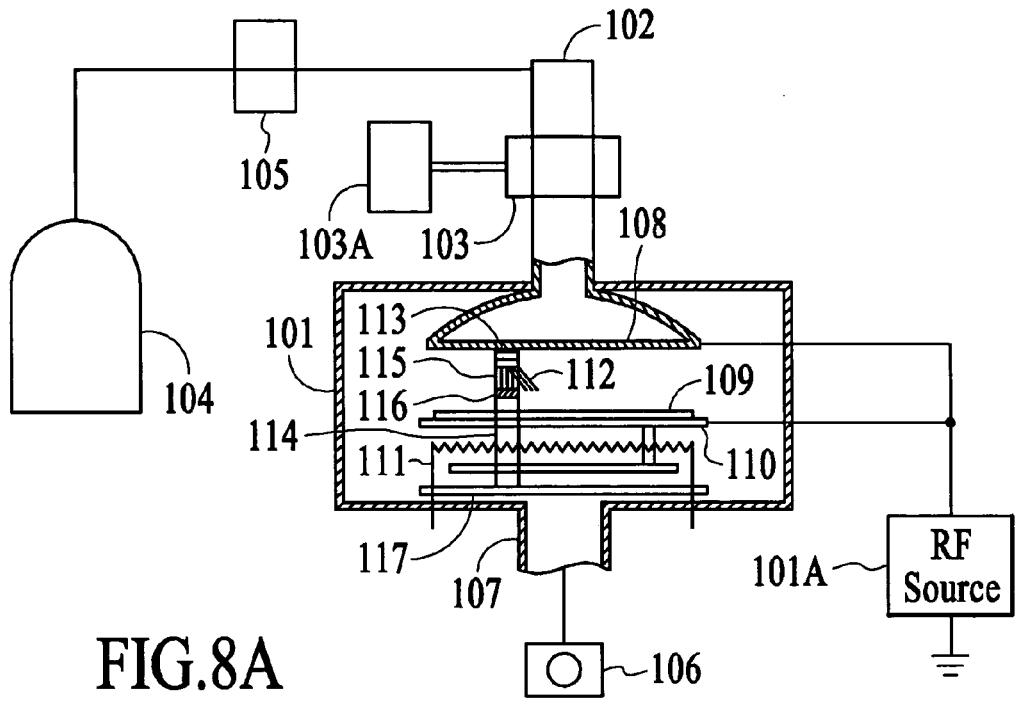
FIGS. 8A and 8B illustrate an assembly for providing remotely generated plasma and/or an RF-generated plasma, with a preferably cryogenic cleaning assembly integrally provided therewith.
Figure 8B:
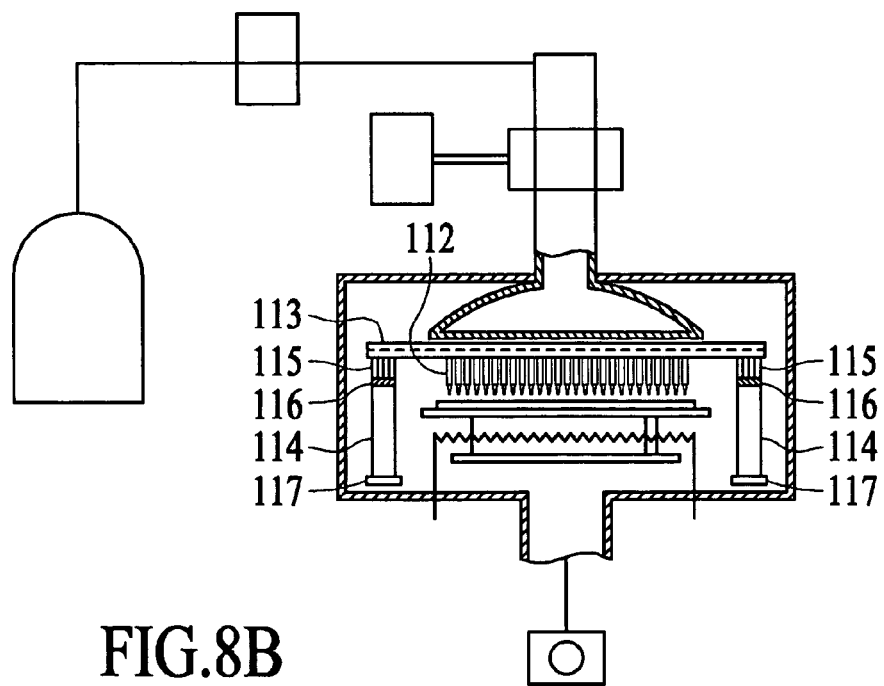

Turning now to FIGS. 8A and 8B, exemplary preferred embodiments of the present invention described in the Second Referenced Applications will now be provided.

Referring to FIG. 8A, gas source 104 provides a source of reactant gas, which in preferred embodiments may consist of, for example, gases selected from the group consisting of oxygen, nitrogen, hydrogen, fluorine, hydro fluorocarbon or a mixture of such gases, representative examples being O2, N2, H2, CF4 and NF3, etc. The reactant gas(es) preferably is/are provided through compressed cylinder(s) such as is illustrated by gas source 104 (hereinafter, the reactant gas or gases or referred to simply as the "reactant gas"). In preferred embodiments, the reactant gas is supplied via mass flow controller(s) 105 (which serve to control the flow of the reactant gas) and pipe 102 to plasma applicator 103, which in preferred embodiments consists of a microwave discharge apparatus, which includes or is coupled to microwave source 103A. Microwave source 103A and plasma applicator/microwave discharge 103 create free radicals from the reactant gas, which may then be supplied to vacuum processing chamber 101. The reactant gas free radicals preferably are introduced into processing chamber 101 via a gas distribution system or implement, which in FIG. 8A is illustrated as showerhead 108, such that the activated reactant gas/free radicals are presented to, and may react with, material of the article being processed (indicated as wafer 109 in FIG. 8A, which has been introduced into processing chamber 101 as illustrated).

In preferred embodiments, heated wafer holder 110 is provided over heating implement 111, which optionally provides heat preferably via an electric heating element from the back side of wafer 109, in a manner as is known in the art. As will be appreciated, heating implement 111 may be controlled to provide the proper and optimum temperature for the particular process. Pressure within processing chamber 101 is controlled in part via exhaust pump 106, which is in flow communication with processing chamber 101 via exhaust pipe 107.

It also should be noted that RF source 101A is optionally provided as illustrated. In such embodiments, wafer holder 110 preferably serves as a first electrode, and a second electrode is provided, which may consist of the housing of processing chamber 101 or showerhead 108 as illustrated in FIG. 8A. In accordance with certain embodiments of the present invention, RF source 101A provides RF energy that creates an RF plasma that produces radicals and ions from the reactant gas that are provided to wafer 109, such as for ashing or removing a photoresist-type layer on wafer 109. In certain embodiments, only an RF plasma is utilized (and thus the remote plasma discharge 103 is not provided or operative), while in other embodiments only the radicals produced by remote plasma discharge 103 are utilized (and thus RF source and/or the first and second electrodes are not provided or are not operative), while in yet other embodiments both the RF plasma and the radicals produced by remote plasma discharge 103 are utilized. It should be understood that the RF plasma and electrodes may be biased and controlled such that what is known as an RIE process may be carried out, although the present invention is not limited thereto. What is important is that one or more plasma/free radical sources are provided to deliver the reactant gas species to the surface of wafer 109 such that the photoresist or similar layer thereon may be attacked chemically (which may have a physical component as well, in the case of an RIE process) so as to ash or remove the photoresist layer. An exemplary disclosure of such an apparatus having a microwave discharge implement and an RF/RIE plasma is U.S. Pat. No. 5,795,831, which is hereby incorporated by reference for background purposes.

In conventional approaches, a de-ionized water or solvent process is provided after plasma treatment in order to remove residue resulting from the plasma process. The necessity of such a DI water and/or solvent cleaning has been determined to be detrimental to optimum processing, and in accordance with embodiments of the present invention a cryogenic cleaning process is performed as part of, or subsequent to, the plasma process. As illustrated in FIG. 8A, nozzle/nozzle assembly 112 is provided with a transport mechanism that moves nozzle/nozzle assembly 112 relative to wafer 109 in a manner such that the cryogenic cleaning medium (preferably consisting of or including carbon dioxide) impinges on and over the surface of wafer 109. The use of the cryogenic cleaning process, in combination with the remotely-generated and/or RF generated plasma, has been determined to provide more optimum removal of photoresist-type layers.

In accordance with certain preferred embodiments, an oscillatory or vibratory discharge of the cryogenic cleaning medium is provided in order to provide more optimum cleaning. While the Referenced Applications described exemplary ways of implementing such an oscillatory or vibratory mechanism, the embodiment illustrated in FIG. 8A illustrates another exemplary mechanism. As illustrated in FIG. 8A, an oscillatory/vibratory nozzle cleaning system, preferably dispensing cryogenic, solvent or solvent combination cleaning medium(s) to assist the plasma cleaning and photoresist stripping/removal process. The oscillatory/vibratory nozzle cleaning and plasma processes can be performed sequentially or simultaneously, as will be described in greater detail hereinafter. In the illustrated embodiment, the oscillatory/vibratory nozzle cleaning system includes vibration actuators 115, which are attached to nozzle manifold 113 to induce the oscillation or vibration. The oscillatory/vibrator nozzle cleaning system preferably is mounted on vibration isolators 116 to prevent vibration of posts 114. Posts 114 (preferably two) are mounted on linear slide assembly 117 to allow nozzle/nozzle assembly to "sweep" wafer 109 with the cryogenic cleaning medium Nozzle manifold 113 preferably utilizes a pressurized plenum to ensure uniform flow through nozzle/nozzle assembly 112. It should be noted that the oscillatory/vibratory nozzle system of FIG. 8A is exemplary; what is important is that the process chamber include plasma treatment capability such as has been described, and also a preferably integral type of cryogenic cleaning medium assembly that can movably or otherwise provide the cryogenic cleaning medium on and over the surface of wafer 109.

In operation, wafer 109 is introduced into processing chamber 101; in an illustrated embodiment, wafer 109 includes a photoresist or similar-type layer that needs to be removed. Plasma/free radicals are generated via the reactant gas (either via plasma applicator/microwave discharge 103 and/or an RF plasma, etc.), which preferably chemically attack and remove the material of the photoresist layer. In the case of reactant gas that is free radicalized via plasma applicator/microwave discharge 103, free radicals and ions are generated from the reactant gas, although it is believed (without being bound by theory) that the concentration of ions that are introduced into processing chamber 101 is low due to the relatively high operating pressure that may be utilized. Either subsequent to or interspersed with plasma processing steps, one or more cryogenic cleaning steps are performed, which serve to remove (preferably with a mechanical type action) residues and contaminants that are present after the plasma/free radical treatment. Without being bound by theory, it also is believed that plasma treatment subsequent to a cryogenic cleaning step helps remove residue that exists after the cryogenic cleaning step, and that the cryogenic cleaning subsequent to a plasma/free radical treatment helps remove residue that exists after the plasma treatment. In combination, it has been determined that such combined processing produces a more optimum photoresist-type layer removal process, which may eliminate or substantially reduce the need for a DI water or solvent rinse process.

FIG. 8B illustrates another view of the embodiment described in connection with FIG. 8A (although for simplicity, for example, RF source 101A has not been shown in FIG. 8B). FIG. 8B illustrates an embodiment of nozzle/nozzle assembly in flow communication with nozzle manifold 113, and preferably positioned on vibration actuators 115 and vibration isolators 116, which in turn are positioned on posts 114, the assemblage of which is movable via, for example, linear slide assembly 117. Other aspects of FIG. 8B discussed in conjunction with FIG. 8A will not be further discussed.

Figure 11A:
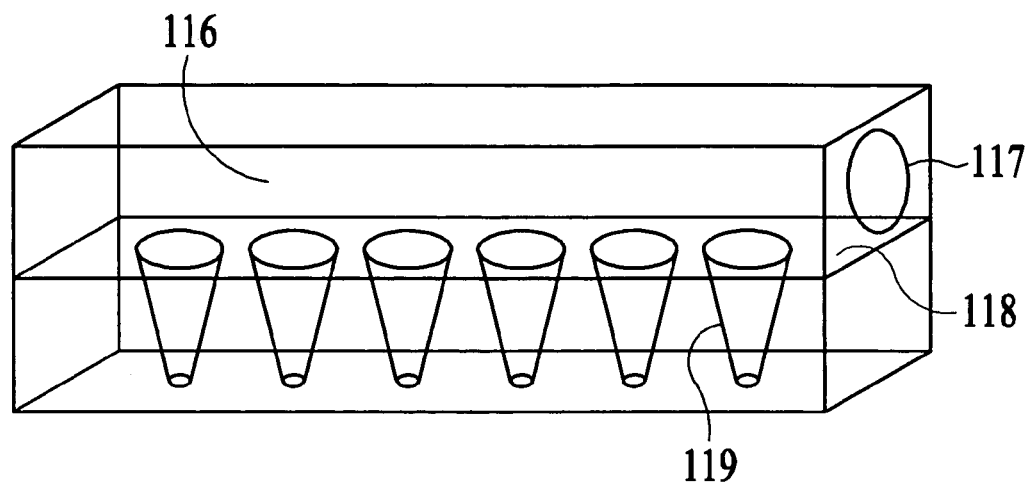
FIGS. 11A and 11B illustrate two alternative nozzle assemblies utilized in certain preferred embodiments.
Figure 11B:
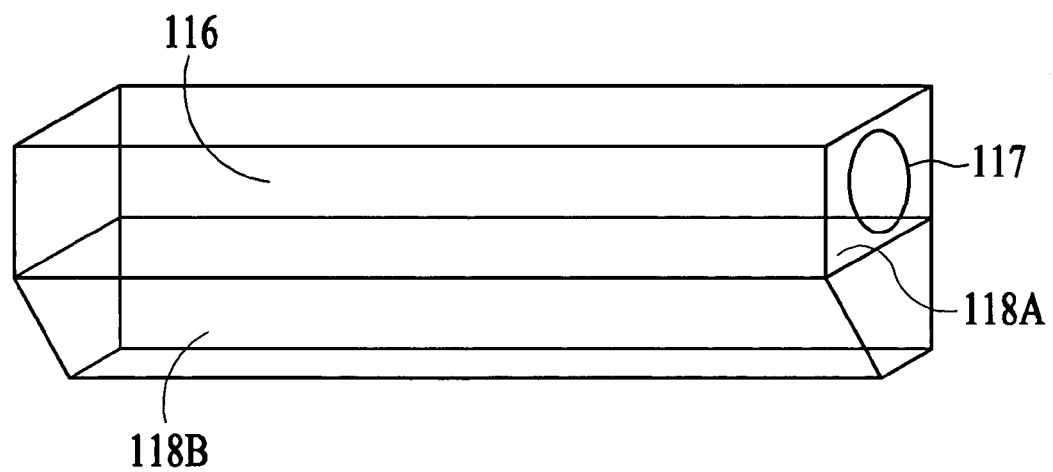

In addition, FIGS. 8A and 8B illustrate a nozzle assembly, another exemplary preferred embodiment of which is illustrated in FIG. 11A. As illustrated in FIG. 11A, cryogenic medium inlet 117 is provided, which is in flow communication with pressure plenum 116. A perforated plate or surface 118 is provided in flow communication with pressure plenum 116, such as is illustrated. As part of, or coupled to, perforated plate or surface 118, but in any event in flow communication therewith, are preferably axi-symmetric nozzles 119. Nozzles 119 may be holes of a tapered or conical shape (or other shape to provide the desired nozzle characteristics) formed in a relatively thick plate (thick enough to accommodate the desired nozzle shape and provide the necessary mechanical strength, etc.). Alternatively, as illustrated in FIG. 11B, perforated or slotted plate 118A may be provided, with planar nozzle system 118B provided. As illustrated, planar nozzle system 118B may consist of two inclined planes coupled to form a slotted or planar nozzle. Again, as will be appreciated, such a planar nozzle assembly will have internal shapes and an exit orifice or orifices in order to distribute the cryogenic cleaning medium in a desired manner, etc.

Figure 9:
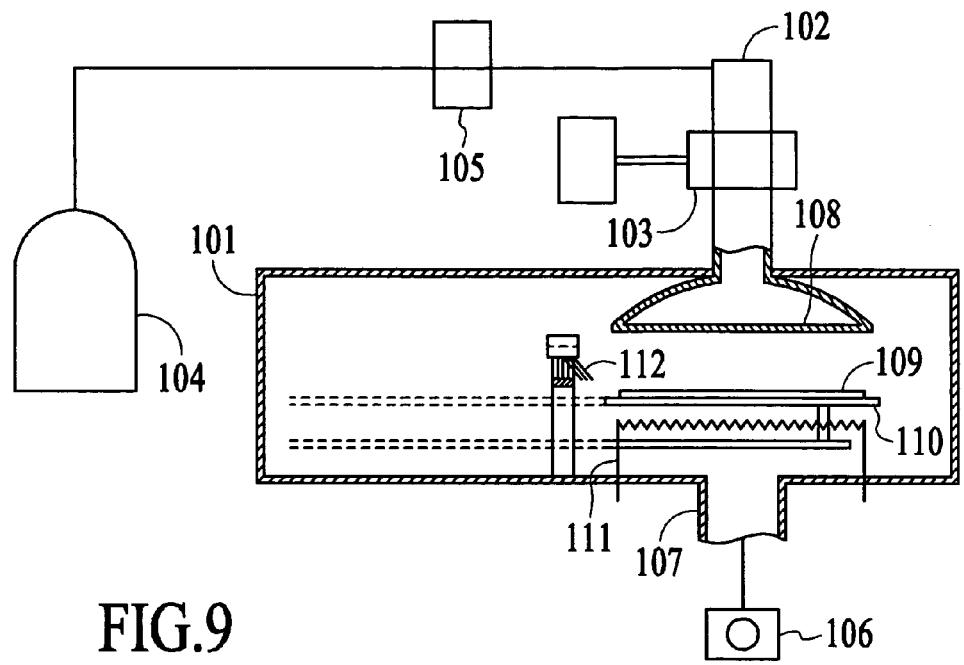
FIG. 9 illustrates an assembly for providing remotely generated plasma and/or an RF-generated plasma, with a preferably cryogenic cleaning assembly provided separate therefrom, with the article transported in order to be cryogenically cleaned.

FIG. 9 illustrates an alternative embodiment in which nozzle/nozzle assembly 112 is stationary, and wafer 109 moves relative to nozzle/nozzle assembly 112. In such an embodiment, wafer holder 110 consists of, or is on, a movement mechanism such as a linear slide assembly such that after plasma processing, wafer 109 is moved relative to nozzle/nozzle assembly 112 such that the cryogenic cleaning medium is presented to the surface of wafer 109 such as has been previously described. Also as previously described, the cryogenic cleaning medium may be delivered in an oscillatory or vibratory manner (although this is not required in all embodiments), which may be via a mechanism such described in connection with FIGS. 8A and 8B, or which may be via the oscillatory mechanisms as described in the Referenced Applications (and described above). Other aspects of the embodiment of FIG. 9 that are in common with the embodiments of FIGS. 8A and 8B, including the use of an RF source to generate an RF/RIE type plasma treatment, which will not be further described for purposes of convenience.

Figure 10:
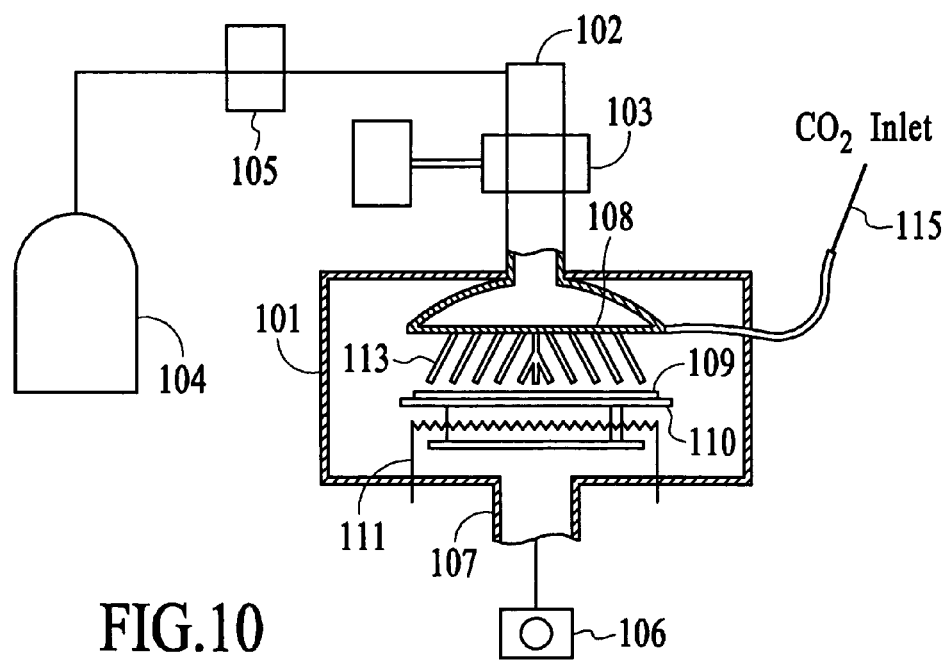
FIG. 10 illustrates an assembly for providing remotely generated plasma and/or an RF-generated plasma, with a preferably cryogenic cleaning assembly utilizing a common showerhead-type electrode.
Figure 12:
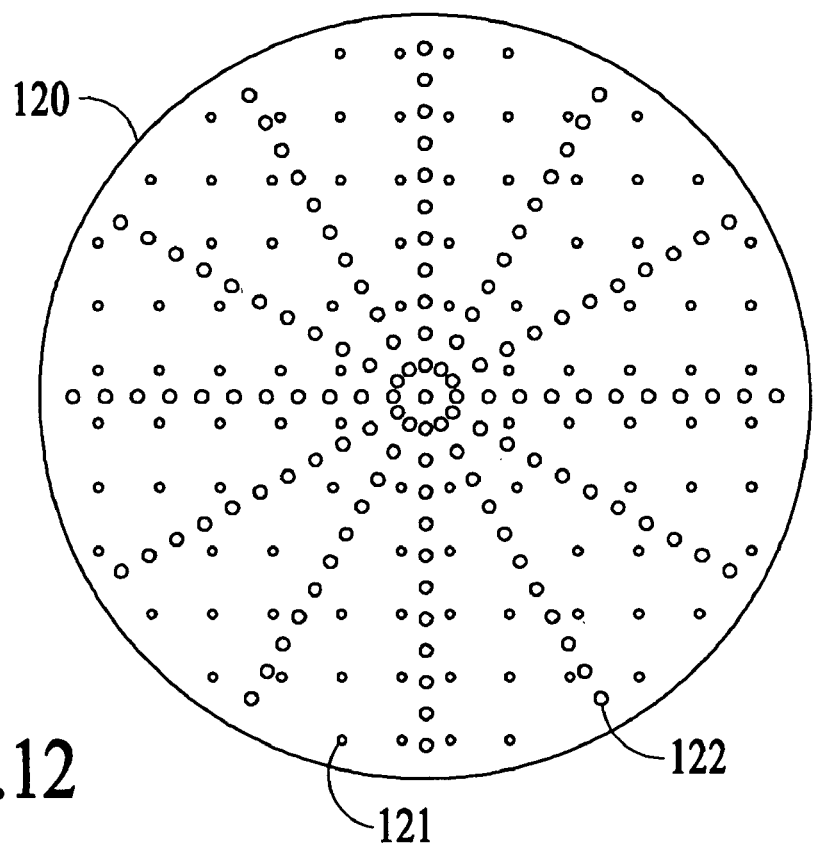
FIG. 12 illustrates a showerhead-type gas distribution implement utilized in certain preferred embodiments.

FIG. 10 illustrates a further alternative embodiment, wherein showerhead 108 includes inlet 115 for purposes of introducing the cryogenic cleaning medium (e.g., carbon dioxide). In such embodiments, showerhead 108 provides for delivery of free radicals generated from the reactant gas to the surface of wafer 109, while also providing for delivery of the cryogenic cleaning medium to the surface of wafer 109. In an illustrative operation of such an embodiment, a plasma/free radical treatment may be provided (which may be accompanied or substituted by an RF/RIE plasma treatment, such as previously described), which may involve showerhead 108 distributing free radicals generated from the reactant gas at a first point in time (plasma treatment phase), and distributing the cryogenic cleaning medium at a second point in time (cryogenic cleaning phase) (the distribution of free radicals and/or cryogenic cleaning medium is illustrated in FIG. 10 by spray pattern 113). In certain embodiments, a single set of distribution holes are provided in showerhead 108, with the reactant gas flow and the cryogenic cleaning medium flow alternatively turned on and off. As illustrated in FIG. 12, however, showerhead 120 may be provided, which includes separate distribution holes for the plasma/free radicals (holes 122) and cryogenic cleaning nozzles (holes 121). In such embodiments, holes 122 have a size and shape for the more optimum delivery of plasma/free radicals, while holes 121 have a size and shape for the more optimum delivery of the cryogenic cleaning medium. In one exemplary embodiment, the size of holes 122 is greater than the size of holes 121, and preferably hole 121 are formed to provide a nozzle effect for the dispersal and distribution of the cryogenic cleaning medium, etc. As the characteristics of the medium passing through the holes, and the more optimum delivery conditions from the holes, are quite distinct, having first and second holes of differing sizes and shapes and flow characteristics has been determined to provide more optimum results in such embodiments.

Figure 13:
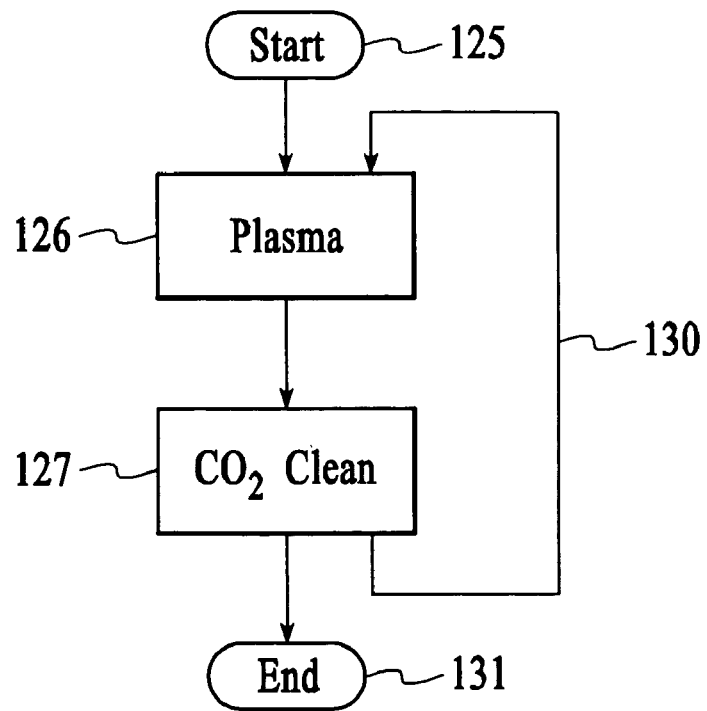
FIG. 13 is a simplified flow diagram illustrating certain preferred process flows in accordance with certain embodiments of the present invention.

FIG. 13 illustrates a general process flow in accordance with preferred embodiments of the present invention. As previously described, an article, wafer, substrate, etc. having a layer to be removed (e.g., a photoresist-type layer) is introduced into the processing chamber. This generally is illustrated by start step 125. At step 126, a plasma treatment step. is provided, such as previously described. This may consist of plasma/free radicals remotely generated such as previously described, and/or an RF or RIE type plasma treatment, also such as previously described. At step 127, a cryogenic cleaning (e.g., carbon dioxide) process is performed, such as previously described. This may be a two step, two phase process, where a single plasma phase/step 126 is performed, and then a single cryogenic cleaning phase/step 127 is performed, with the flow then stopping as illustrated by end step 131. In alternate embodiments, however, as indicated by flow path 130, a plasma treatment phase/step is provided followed by a cryogenic cleaning phase/step, with the plasma treatment-cryogenic cleaning steps repeated a plurality of times. In such embodiments, and without being bound by theory, it is believed that the plasma treatment phase provides a primarily chemical means for removal of the target material, while the cryogenic cleaning phase removes residues and materials present after the plasma treatment phase, and with a subsequent plasma treatment phase helping remove residue and materials present after the cryogenic cleaning phase. While not illustrated in FIG. 13, in certain such embodiments, the process begins and ends with a plasma treatment phase.

In the addition to the foregoing discussion relating to the First and Second Referenced Applications, additional refinements and inventions based thereon will now be described.

Figure 14A:
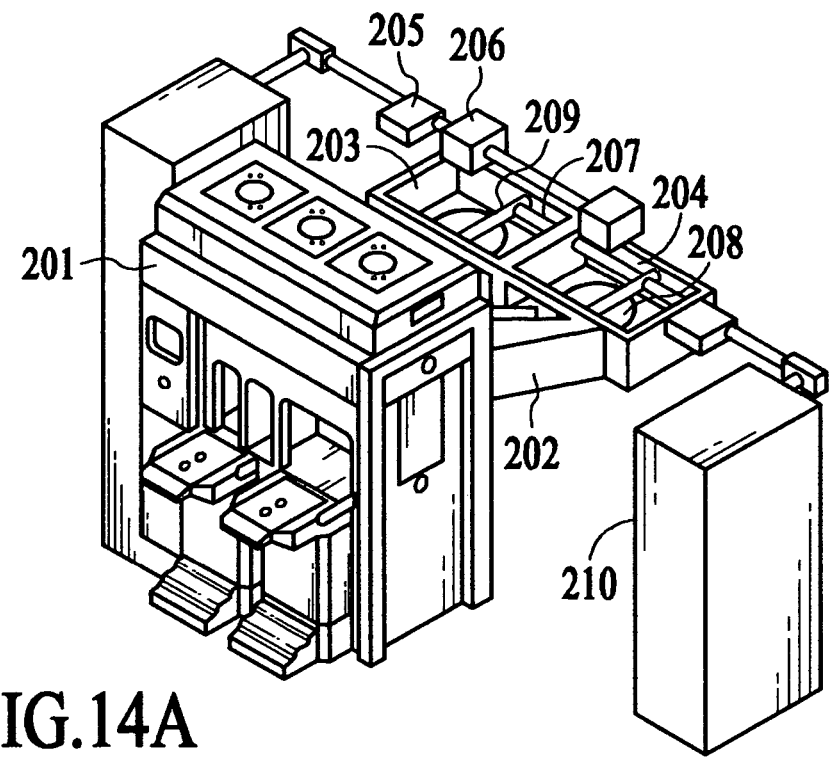
FIG. 14A is perspective drawing illustrating a cleaning system in accordance with certain preferred embodiments with two vacuum chambers each with a plasma and cryogenic source such as $CO_2$.

Reference is now made to FIG. 14A, wherein one exemplary preferred embodiment of the present invention is illustrated. Front end system 201 is provided for introducing the articles to be processed into the system. From front end system 201 the articles are transported thru a vacuum robot in vacuum/robot environment 202 and then into either one of vacuum chambers 203 and 204 as illustrated in FIG. 14A. The vacuum robot may be of conventional design and preferably has an extendable and retractable arm, providing movement in a horizontal direction, and a laterally extending arm segment disposed for rotation about an axis at the upper end of the arm In certain preferred embodiments of the present invention, both vacuum process chambers 203 and 204 are identical and include plasma generation 205 and plasma delivery system 206 as well as cryogenic spraying nozzle assembly source 207. In accordance with such embodiments, parallel processing of two articles/wafers can be performed simultaneously. Plasma generator 205 preferably is mounted adjacent to each of vacuum chambers 203 and 204 and is in communication with these chambers in order to provide free radicals into these chambers and any necessary reactive gas(es) required for the desired process. Plasma generation 205 and plasma delivery system 206 preferably are implemented for chemical removal of a layer (e.g., photoresist) from article 208 and preferably include a support structure within the vacuum chamber, holding chuck 209 configured to secure the article to be processed, a stage means mounted on the support structure for mounting holding chuck 209, a heater mounted on the bottom of holding chuck 209 to provide the required temperature of article 208. Cryogenic spray nozzle assembly 207 for spraying cryogenic fluid consists of cryogenic filtration system 210 that preferably is attached to the vacuum chamber on the outside to provide an ultra clean cryogenic flow to nozzle system 207 that is inside of vacuum chambers 203 and 204. The cryogenic flow preferably goes through a pulsating valve to provide the oscillating flow to the spray nozzle mounted in cryogenic spray nozzle assembly 207 in communication with the cryogenic cleaning medium for providing a cleaning spray. Also, in certain preferred embodiments a slide mechanism is attached to cryogenic spray nozzle assembly 207 for providing movement thereof relative to the article support structure on a predetermined path in order to completely sweep or clean the surface of article 208. Cryogenic spray nozzle assembly 207 preferably produces pulsating cyclic flow of the cleaning medium in the spray nozzle so that the cleaning spray dynamically impinges article 208 in an oscillatory or repeating motion. Without being bound by theory, it is believes that pulsating flow helps to penetrate any boundary layer on article 208 and otherwise helps to remove sub micron contaminants.

Figure 14B:
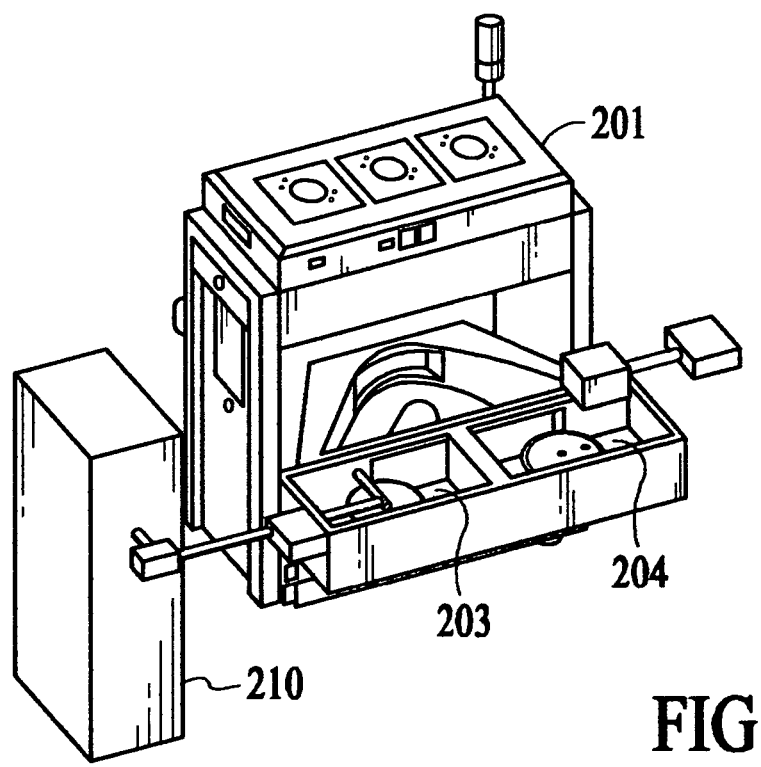
FIGS. 14B and 14C are perspective drawings illustrating another cleaning system in accordance with certain preferred embodiments with two vacuum chambers, one chamber with a plasma source while the other vacuum chamber has a cryogenic source such as $CO_2$.
Figure 14C:
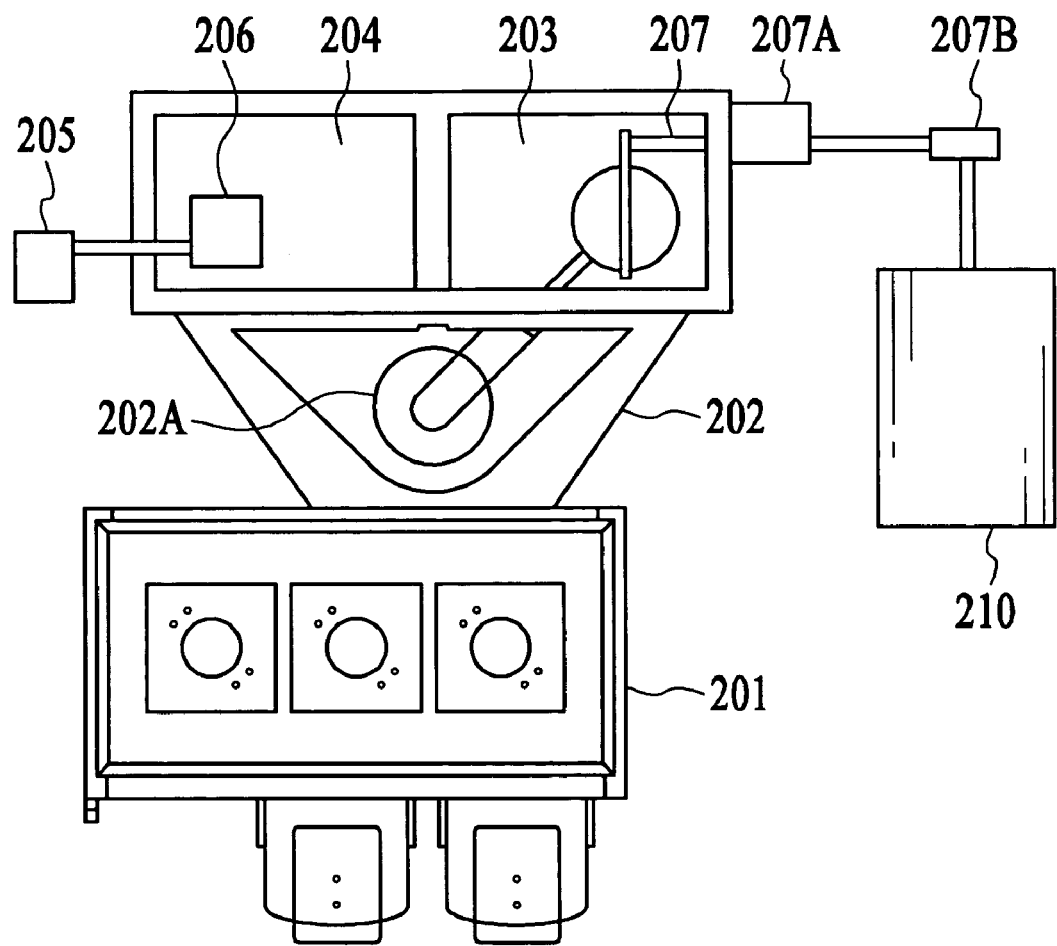

In another exemplary embodiment illustrated in FIGS. 14B and 14C, a system with two vacuum chambers 203 and 204 is provided. The system of this embodiment is similar to that illustrated in FIG. 14A except that vacuum chamber 204 preferably is dedicated for plasma generation 205 and plasma delivery system 206 such as described earlier, while second vacuum chamber 203 includes cryogenic spray nozzle assembly 207 and is dedicated for the cryogenic vibrating and pulsating spray process for article 208. In accordance with this embodiment, each vacuum process chamber 203 and 204 contains the components/assemblies required for the particular process to which the chamber is dedicated, with vacuum robot 202A introducing article 208 into the appropriate chamber for the desired process. In vacuum chamber 204 the plasma process is applied, and this chamber includes plasma delivery system 206 coupled to plasma generation 205, which preferably is mounted adjacent to it to provide a mixture of gases to the plasma distribution system 206 that is sitting inside the vacuum chamber and is in communication with it to provide the necessary reactive gas for the process required. In vacuum chamber 203 that is dedicated to the cryogenic process, cryogenic spray nozzle assembly 207 is provided, which receives cryogenic cleaning medium from cryogenic filtration system 210 which preferably is provided on the outside to provide an ultra clean cryogenic flow to the nozzle system 207 that is inside of vacuum chamber 203. The cryogenic flow preferably goes through pulsating valve 207A to provide the oscillating flow to spray nozzle assembly 207. Nozzle drive system 207B preferably is provided to provide the movement of nozzle assembly 207 sufficient to clean the entire surface of article 208. In an alternative embodiment, purification system 210 is located away from the process chamber and clean cryogenic medium is piped into the nozzle system. In such embodiments, it is possible to produce a high capacity cryogenic filtration system that would supply the clean cryogenic medium to multiple process tools with multiple process chambers and nozzle systems, etc.

Figure 15A:
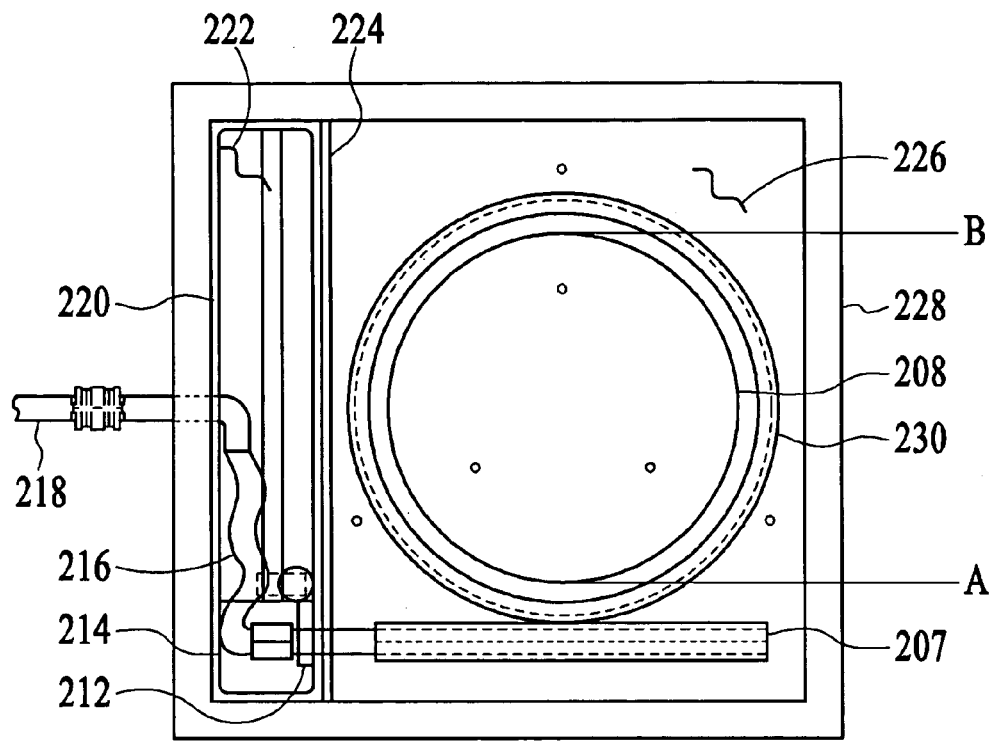
FIGS. 15A and 15B are diagrams illustrating a cryogenic vacuum chamber for one embodiment of the present invention in which the slide mechanism and drive motor are located inside the vacuum chamber.
Figure 15B:
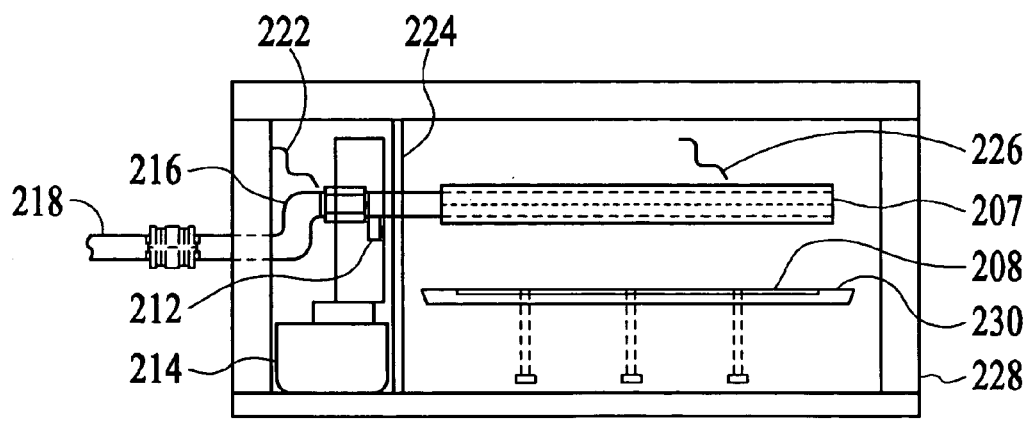

FIGS. 15A and 15B are diagrams illustrating a cryogenic vacuum chamber for one exemplary preferred embodiment of the present invention. In these figures, the cryogenic spray assembly is enclosed inside the cryogenic vacuum chamber 228. Chamber 228 has partition wall 224 with a slot through which cryogenic spray nozzle 207 extends. Partition wall 224 divides cryogenic spray chamber 228 into two sections, one section 222 with the track, drive motor 214 and slide mechanism assembly 220 in it, while the other section 226 contains article to be cleaned 208 and cryogenic spray nozzle 207. Slide mechanism 220 and drive motor 214 preferably are located on the bottom of the chamber of section 222 at a point below article 208 in neighboring section 226 while separated by partition wall 224 in order to help prevent particulates that might be generated and deposited on article 208. Flexible and preferably all metal tube 216 is connected to the inlet of the nozzle at one end and from the other end to a fitting at the sidewall of the chamber through which the cryogenic fluid in introduced. Flexible tube 216 allows nozzle assembly 207 to sweep article 208 while it is connected to the source of the cryogenic fluid. Partition wall 224 serves to help prevent or reduce cross flow between the two sections 222 and 226 and also to help protect slide mechanism 220 and drive motor 214 from the plasma gases that are introduced to article 208 in neighboring section 226 (for clarity, FIGS. 15A and 15B do not show the implements for carrying out the plasma process, such as described elsewhere herein), while at the same time protecting article 208 in section 226 from possible contamination introduced by slide mechanism 220 and drive motor 214 in section 222. In the event that particulates are generated in section 222 from slide mechanism 220 and/or motor drive 214, a vacuum port preferably is provided beneath these components in order to allow such particulates to be transported outside the chamber. Cryogenic spray nozzle 207 preferably is attached to block 212 on slide mechanism 220 in such a way that, when the slider moves from position A to position B (where the length from position A to position B is the maximum diameter length of the article to be cleaned), cryogenic spray nozzle 207 will sweep that length. In such embodiments of cryogenic chamber 228, article 208 preferably is placed on electrostatic chuck 230 with enough applied voltage to the chuck to ensure that the momentum of the spray does not cause any movement of article 208 while spray nozzle 207 sweeps over it with cryogenic fluids coming from valve 218.

Figure 16A:
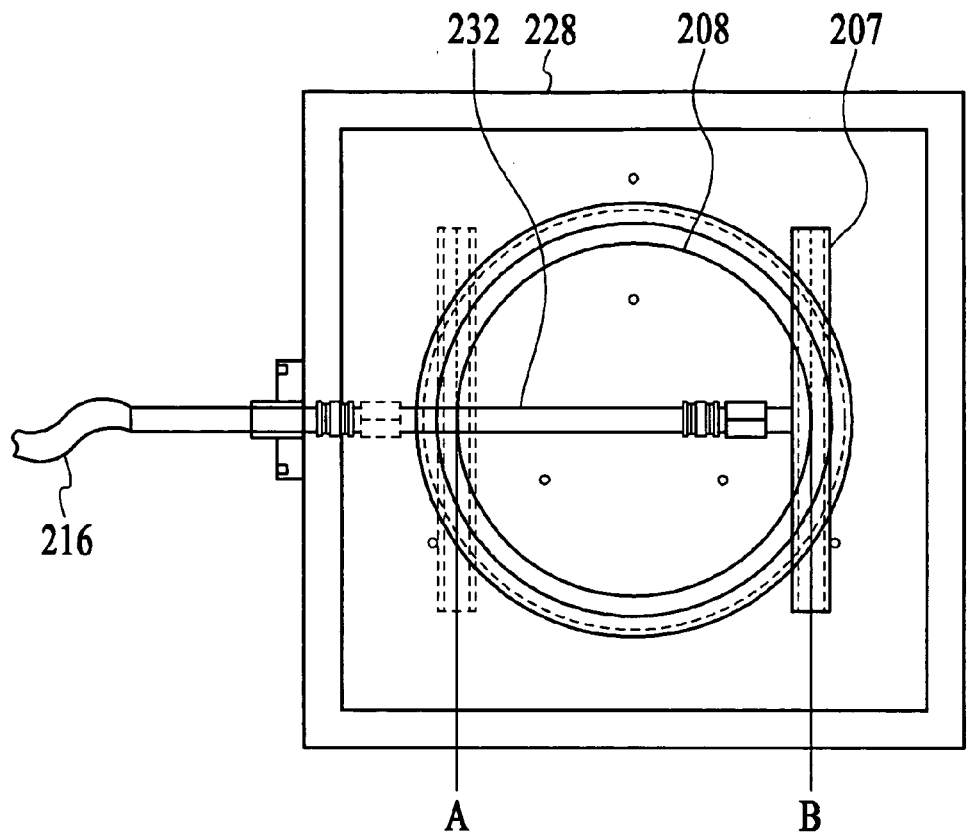
FIGS. 16A and 16B are diagrams illustrating a cryogenic vacuum chamber for another preferred embodiment of the system of the present invention in which the slide mechanism and drive motor are outside the vacuum chamber and the cryogenic spraying nozzle is inside the vacuum chamber.
Figure 16B:
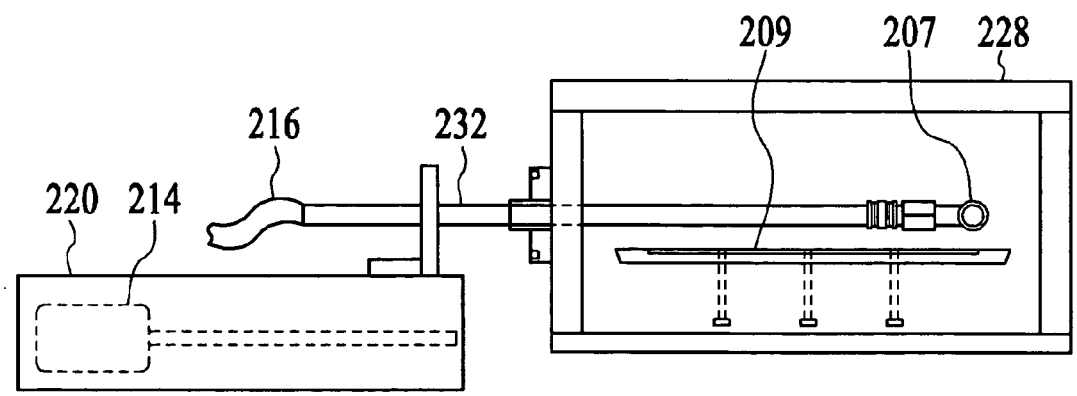

FIGS. 16A and 16B are diagrams illustrating cryogenic vacuum chamber 228 in accordance with an alternative preferred embodiment of the present invention. In accordance with this illustrative embodiment, slide mechanism 220 and drive motor 214 are outside of vacuum chamber 228 and cryogenic spraying nozzle 207 is inside the vacuum chamber. In this embodiment, cryogenic spray assembly shaft 232 preferably is the only assembly part that is enclosed inside cryogenic vacuum chamber 228 and it penetrates vacuum chamber 228 somewhere above the position of article to be cleaned 208, to allow cryogenic spray nozzle 207 to sweep over article 208 (again, components for plasma processing for such a chamber are not shown for purposes of clarity but are described elsewhere herein). The cryogenic spray medium enters vacuum chamber 228 to the nozzle assembly 207 via shaft 232 and shaft 232 is connected to preferably all metal flexible tube 216 to allow the movement of shaft 232 during the sweeping process, where nozzle assembly 207 will be sliding from position A to position B (where the length from position A to position B is the maximum diameter length of the article to be cleaned). The opening from where shaft 232 enters vacuum chamber 228 preferably is equipped with multiple O-rings and plates to prevent vacuum from escaping from the chamber in order maintain a desired vacuum level inside the chamber. In accordance with this embodiment, contamination generated by slide mechanism 220 and drive motor 214 should not affect vacuum chamber 228 or article 208.

Figure 17A:
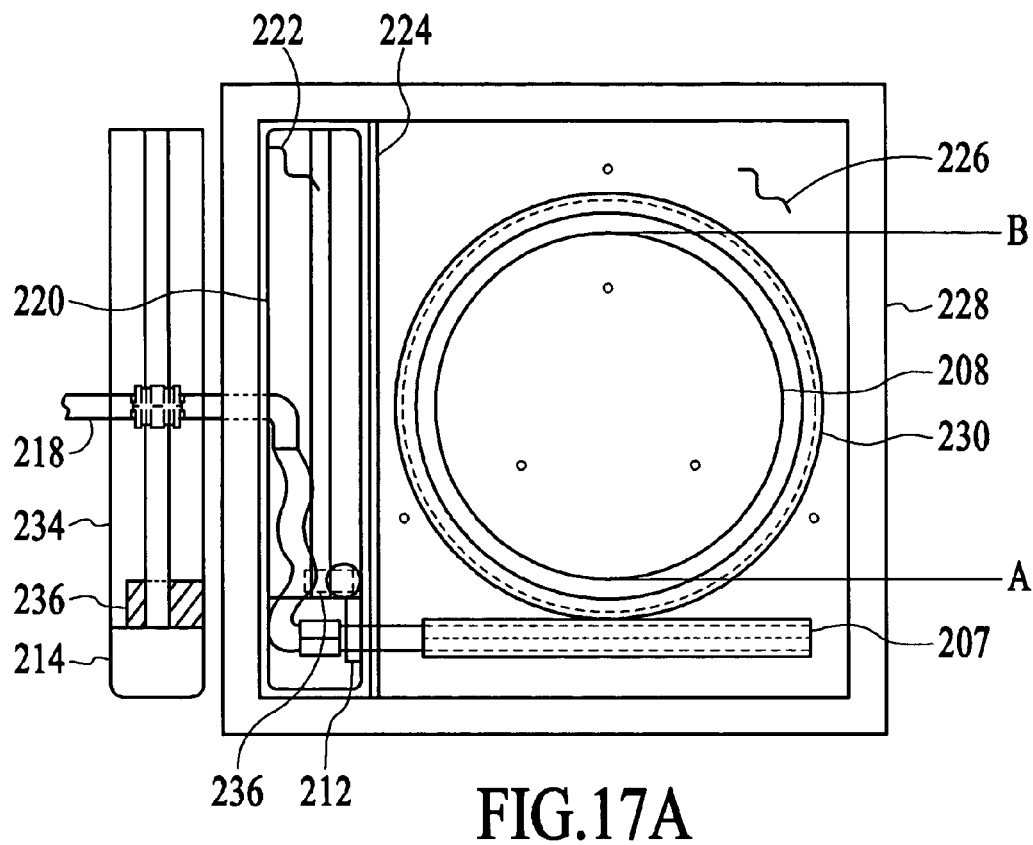
FIGS. 17A and 17B are diagrams illustrating a cryogenic vacuum chamber for another preferred embodiment of the present invention in which the slide mechanism is inside the vacuum chamber and the drive motor is located outside the vacuum chamber controlled by a magnetic coupling system.
Figure 17B:
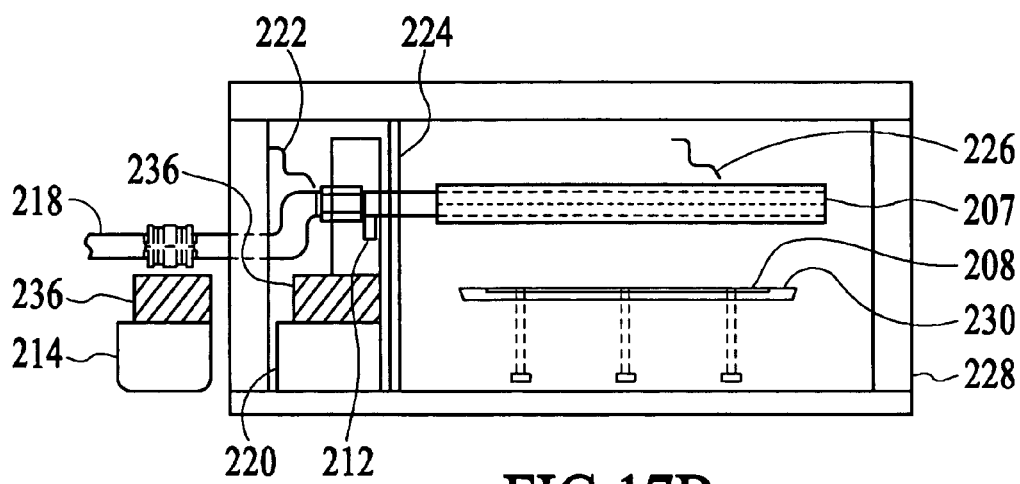

FIGS. 17A and 17B are diagrams illustrating a cryogenic vacuum chamber for another preferred embodiment of the present invention. In accordance with this embodiment of the present invention, track 234 and drive motor 214 are outside vacuum chamber 228, and a magnetically coupled drive system is provided as will be hereinafter described. In this embodiment, the cryogenic spray assembly is enclosed inside cryogenic vacuum chamber 228. Chamber 228 preferably has partition wall 224 with a slot through which cryogenic spray nozzle 207 extends. Partition wall 224 divides cryogenic spray chamber 228 into two sections. Section 222 includes slide mechanism assembly 220 and a magnet 236 attached to slide mechanism 220 on the inside. Track 234 and drive motor 214 also with a magnet 236 is attached to the track on the outside of the vacuum chamber 228 and positioned adjacent to the exterior wall of vacuum chamber 228 where slide mechanism 220 is located on the inside. The two magnets 236 are provided to create a magnetic coupling system that starts when drive motor 214 starts and then will cause cryogenic spray nozzle 207 to start sweeping over article 208. Section 226 contains article 208 and cryogenic spray nozzle 207. Slide mechanism 220 preferably is located on the bottom of the chamber of section 222 at a point below article 208 in neighboring section 226 while separated by partition wall 224 to help prevent particulates that might be generated by slide mechanism 220 or the like and then be undesirably deposited on article 208. Partition wall 224 also helps to reduce cross flow between the two sections 222 and 226, and also helps to protect slide mechanism 220 and magnet 236 from the plasma gases that are introduced to article 208 in neighboring section 226 (for clarity, the implements to provide the plasma processing are not shown in these figures) while at the same time helping to protect article 208 in section 226 from the contamination introduced by slide mechanism 220, etc. In the event that particulates are generated in section 222 such as from slide mechanism 220, preferably a vacuum port is provided in a lower portion of section 222 to allow such particulates to be transported outside the chamber. Cryogenic spray nozzle 207 preferably is attached to block 2125 on cryogenic slide mechanism 220 in such a way that, when the slider moves from position A to position B (where the length from position A to position B is the maximum diameter length of the article to be cleaned), cryogenic spray nozzle 207 will sweep that length. In such embodiments of cryogenic vacuum chamber 228, article 208 preferably is placed on electrostatic chuck 230 with enough applied voltage to the chuck to insure that the momentum of the spray does not cause any movement of article 208 while spray nozzle 207 sweeps over article 208 with cryogenic fluids coming from valve 218.

Figure 18A:
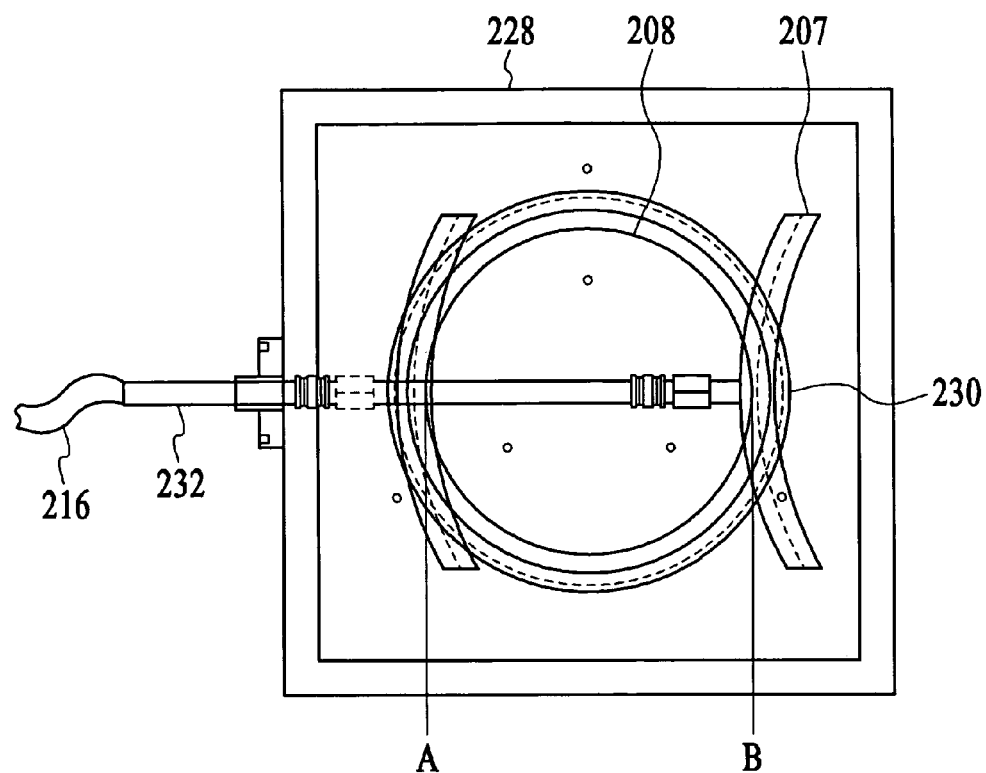
FIGS. 18A and 18B are diagrams illustrating a cryogenic curved spray nozzle system in accordance with other preferred embodiments of the present invention.
Figure 18B:
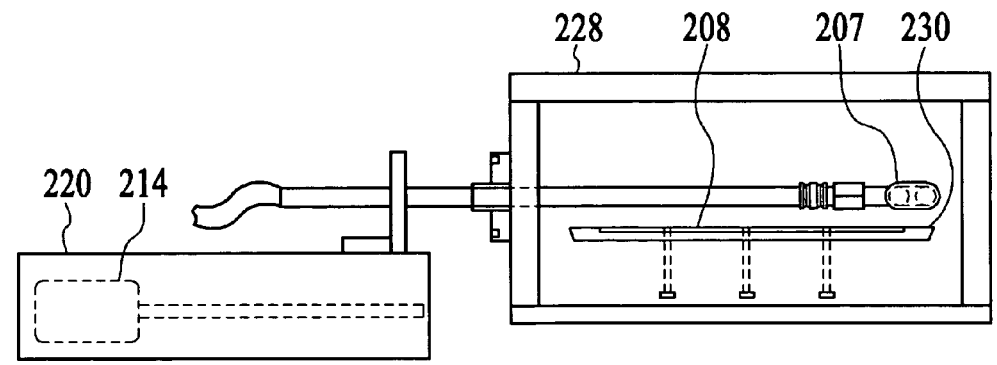

FIGS. 18A and 18B are diagrams illustrating a cryogenic vacuum chamber for another preferred embodiment of the present invention. In accordance with this embodiment of the present invention the cryogenic spraying nozzle has a curved shape that preferably matches, or corresponds in desired manner to, the contour of the wafer or other article. The curve nozzle allows the spraying to occur on at the wafer in the beginning of the spray process. This will reduce the amount of the cryogenic fluid used that misses the wafer surface and reduce the probability of wafer contamination transfer onto the wafer by the impinging spray on surface adjacent to the wafer. This embodiment operates similar to the embodiment discussed in connection with FIGS. 16A and 16B (with the exception of curved nozzle assembly 207 illustrated in FIGS. 18A and 18B).

Figure 19A:
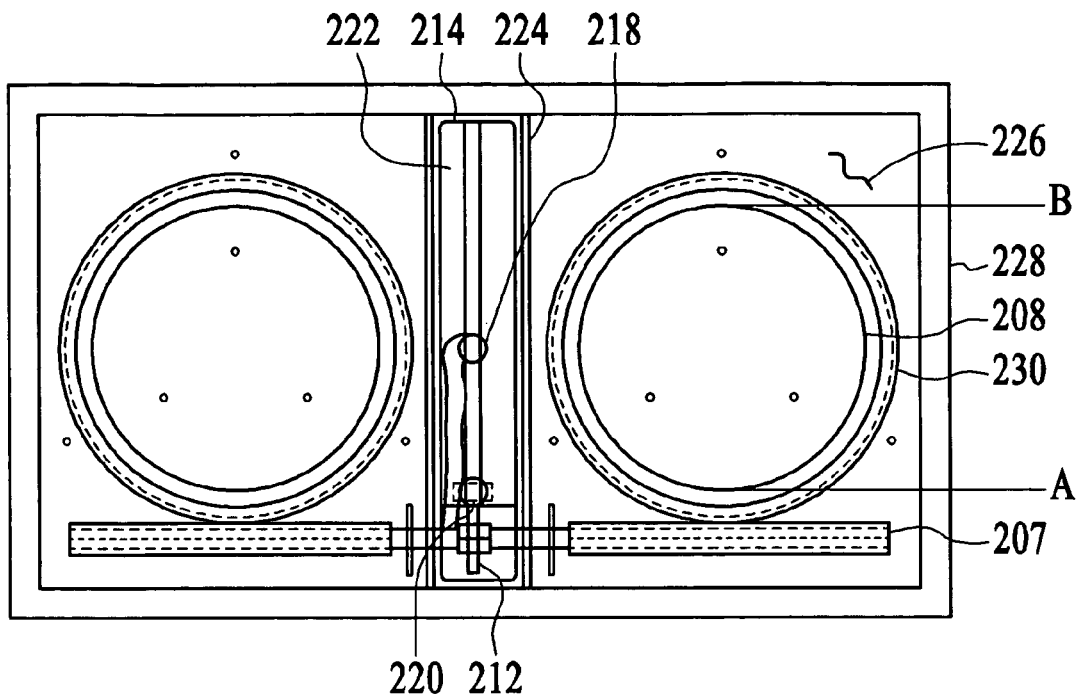
FIGS. 19A and 19B are diagrams illustrating a cryogenic vacuum chamber for another preferred embodiment of the present invention in which the chamber is capable of processing two articles/wafers simultaneously, with the slide mechanism located in the center of the chamber.
Figure 19B:
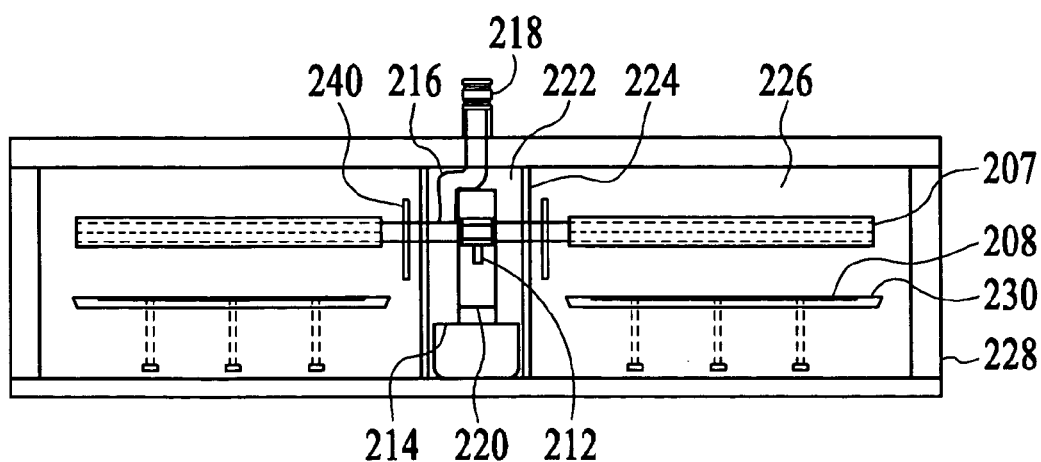

FIGS. 19A and 19B are diagrams illustrating a cryogenic vacuum chamber for another preferred embodiment of the present invention. In this embodiment, the cryogenic spray assembly is enclosed inside cryogenic vacuum chamber 228. Chamber 228 has partition walls 224 with a slot through which cryogenic spray nozzles 207 extend. Partition walls 224 divide cryogenic spray chamber 228 into three sections, one section 22 with the track, drive motor 214 and slide mechanism assembly 220, while two other sections 226 contains two articles to be cleaned 208 and cryogenic spray nozzles 207. Slide mechanism 220 and drive motor 214 preferably are located on the bottom of the chamber of section 222 at a point below articles 208 in neighboring sections 226 while separated by partition walls 224 to help prevent particulates that might be generated by slide mechanism 220 or drive mote 214, etc., and undesirably deposited on articles 208. Preferably flexible all metal tube 216 is connected to the inlet of the nozzles from one end and from the other end to a fitting at the top wall of the chamber through which the cryogenic fluid in introduced via valve 218. Flexible tube 216 allows nozzles 207 to sweep articles 208 while connected to the source of the cryogenic fluid. The nozzle system preferably contains control valves 240 that permit turning the flow on or off on either side of the apparatus in order to control whether to clean either one article at a time or both articles simultaneously. Partition walls 224 server to help reduce cross flow between the two sections 226 and section 222 and help to protect slide mechanism 220 and drive motor 214 from plasma gases that are introduced to articles 208 in neighboring sections 226 while at the same time helping to protect articles 208 in sections 226 from contamination that may be generated by slide mechanism 220 and/or drive motor 214 in section 222

(for clarity, implements for the plasma process are not shown in FIGS. 19A and 19B but are described elsewhere herein). In the event that particulates are generated in section 222 such as from slide mechanism 220 and/or motor drive 214, a vacuum port preferably is provided at a lower portion of section 222 in order to transport the particulates outside the chamber. Cryogenic spray nozzles 207 preferably are attached to block 212 on slide mechanism 220 in such a way that, when the slider moves from position A to position B (where the length from position A to position B is the maximum diameter length of the article to be cleaned), cryogenic spray nozzles 207 will sweep that length.

In accordance with preferred embodiments, an vibrating, oscillating and/or pulsating cryogenic spray is provided to more desirably clean the articles/wafer. Exemplary preferred embodiments of pulsating flows will now be described.

Figure 20:
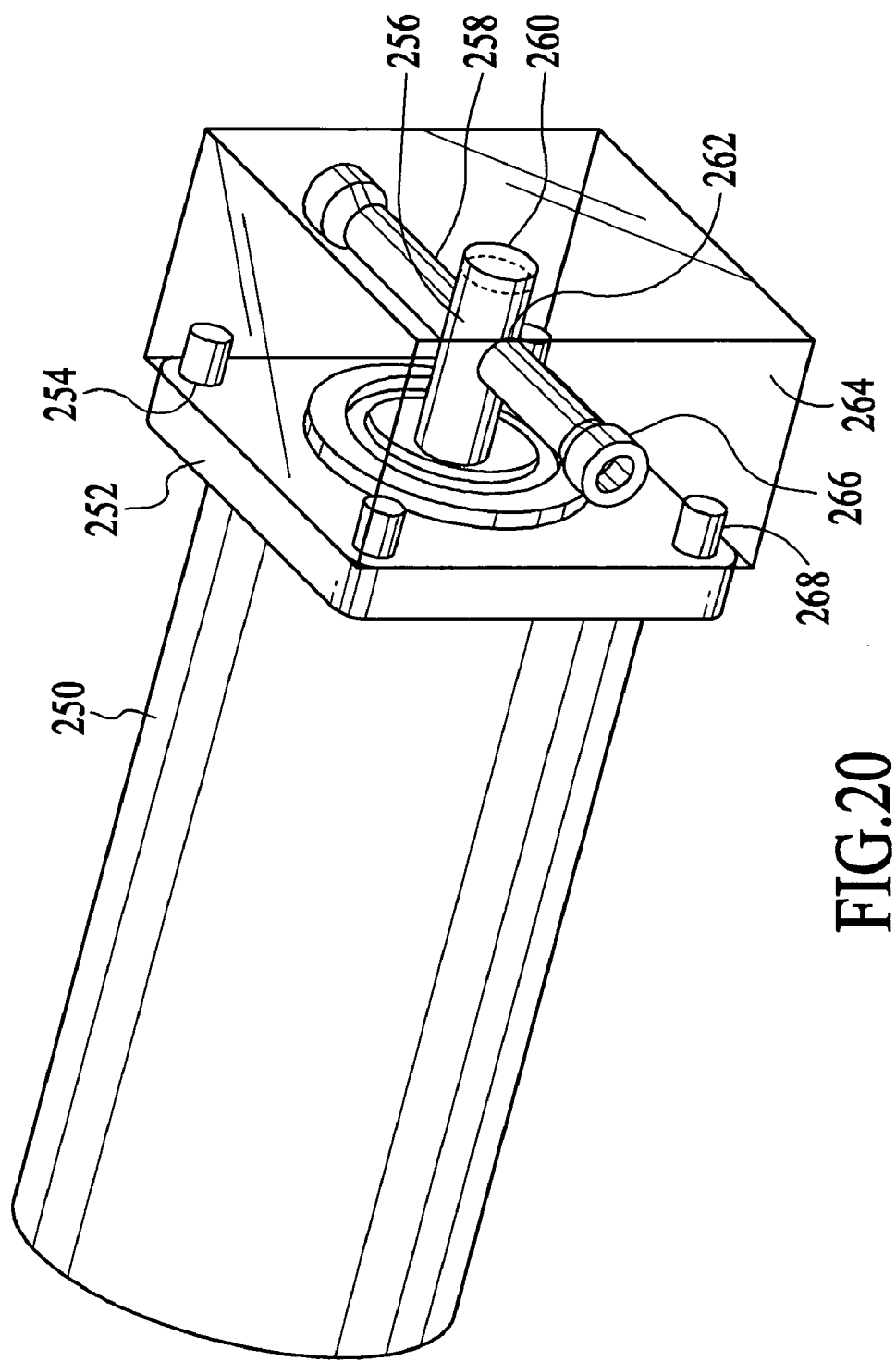
FIG. 20 is a diagram illustrating an assembly for providing pulsating cryogenic flow in accordance with certain preferred embodiments using a brushless motor with radial holes in its shaft inserted in the path of the cryogenic flow to provide flow pulsation.

FIG. 20 is a diagram illustrating a cryogenic pulsation system in accordance with one preferred embodiment of the present invention. The pulsating mechanism in accordance with this embodiment preferably consists of two attached parts: motor 250 and block 264. Motor 250 preferably has a variable and controllable frequency of rotation. Motor shaft 256 has a radial through hole (or multiple radial through holes). Motor 250 preferably includes flange 252 with four (or other suitable number) screw holes 254 near the corners of flange 252. Block 264 preferably has through hole 258 with fittings 266 at both ends of the through hole. Block 264 also preferably has another hole 260 perpendicular to through hole 258 and intersects through hole 258. Hole 260 preferably is not a through hole and does not penetrate the other side of the block. Block 264 preferably has four threaded screw holes 268 near the corners to attach to flange 252 of motor 250. Motor 250 preferably attaches to block 264 by a set of four screws through the screw holes 254 and 268. When motor 250 is attached to block 264, motor shaft 256 would be inserted into block hole 260 in such a way that shaft hole 262 is at the same axial distance from flange 252 as block through hole 258. The source of the cryogenic fluid is connected to inlet fitting 266 to allow the fluid to flow in through hole 258. The cryogenic fluid flows only when shaft hole 262 is aligned with block through hole 258. Hence, rotating motor shaft 256 at a certain frequency causes the flow to turn on and off, or pulsate, based on the same frequency. This results in a desirable pulsating cryogenic flow. In certain cases, for example when the pulsating frequency required is higher than the maximum motor frequency, additional radial holes in shaft 256 can be implemented. Note that in general the addition of one hole in the shaft doubles the frequency of pulsation of the flow.

Figure 21:
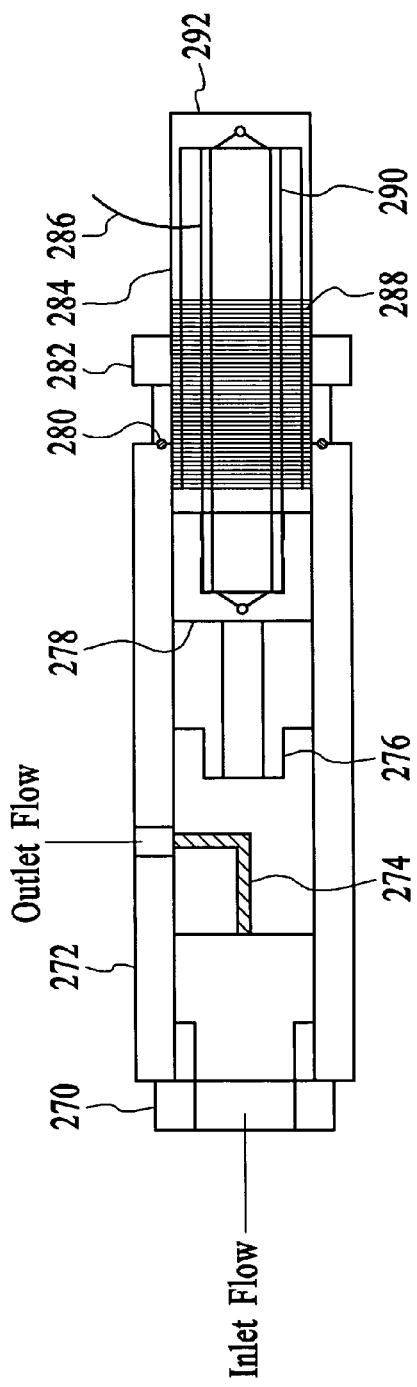
FIG. 21 is a diagram illustrating an assembly for providing pulsating cryogenic flow in accordance with alternative preferred embodiments using piezoelectric system to generate pressure waves.

FIG. 21 is a diagram illustrating a cryogenic pulsation system in accordance with another preferred embodiment of the present invention. The pulsating mechanism in accordance with this embodiment preferably consists of two attached parts: pulsation valve 272 and piezo assembly 292. Piezo assembly 292 preferably consists of piezo element 290, piezo housing 284 and load nut 282. Piezo assembly 292 preferably is screwed to pulsation valve 272 using threads 288 of piezo housing 284. Load nut 282 serves to fix piezo assembly 292 to pulsation valve 272 by tightening load nut 282 against the body of pulsation valve 272 and compressing gasket 280 to prevent leakage from the interface between pulsation valve 272 and piezo assembly 292. A controlled voltage supplied by lead 286 excites piezo element 290. Piezo element 290 expands and contracts longitudinally due to the exciting voltage provided by lead 286. When piezo element 290 is in a position in which it contacts plunger 278 and load nut 282 is tightened, piezo element 290 becomes loaded. When piezo element 290 is loaded and is excited by a control voltage, its longitudinal motion (extraction and contraction) is transferred to plunger 278. The motion transferred to plunger 278 represents controllable longitudinal frequency of motion. The longitudinal motion frequency transferred from plunger 278 to flow valve 276 drives flow valve 276 to open and close at the frequency generated originally by the longitudinal motion of piezo element 290. A cryogenic fluid flowing from inlet flow port 270 will flow through port 274 of flow valve 276 and exit pulsation valve 272, if flow valve 276 is open. The cryogenic fluid flowing from inlet flow port 270 will not flow through port 274 of flow valve 276 if flow valve 276 is closed. The cryogenic fluid flow coming in through port 270 into port 274 of flow valve 276 is then regulated by the frequency of opening and closing of flow valve 276, which is regulated by the controlled longitudinal motion (frequency) of plunger 278 and before that by the controlled longitudinal motion (frequency) of piezo element 290. The motion frequency of piezo element 290 preferably has a wide range, which can be regulated by an electronic frequency generator.

What is important is that a piezo or similar controllable mechanical implement controllably opens and controls (or at least perturbs the flow) a flow valve that controls the cryogenic fluid flow in order to create a pulsation effect as described herein.

Figure 22:
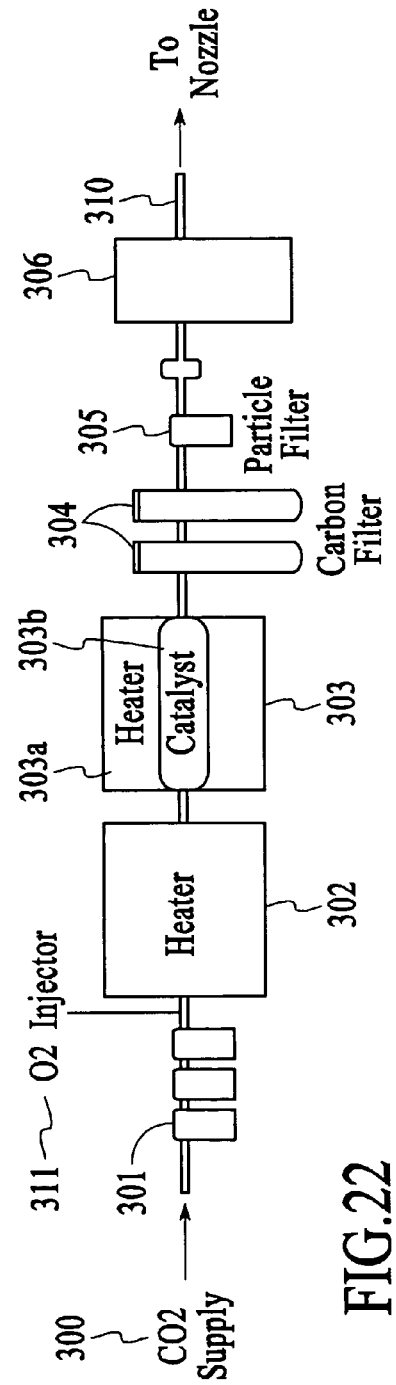
FIG. 22 is a schematic illustrating preferred multi-stage filtering/cleaning of contaminants such as hydrocarbons from a cryogenic cleaning medium such as carbon dioxide.

With reference to FIG. 22, a preferably multi-stage filtering process, which desirably may be utilized with the foregoing cleaning apparatus/method, will now be described (this discussion follows from the First Referenced Applications discussed above). Certain preferred embodiments of the present invention implement a $CO_2$ purification technique, which preferably utilizes a multi-stage, multi-filtering type/mode (multiple, distinct types of filtering processes).

Carbon dioxide typically is a byproduct of a process, and has been determined typically to be contaminated with contaminants such as hydrocarbons and other chemicals. Hydrocarbons typically are soluble in $CO_2$, especially at more elevated temperatures. When using $CO_2$ for example as a cleaning medium in a supersonic nozzle system, the temperature at the exit of the nozzle tends to be very low (e.g., about $-110°$ F.). It has been discovered that, in such processes, hydrocarbons in the $CO_2$ can be released and deposited on the surface being cleaned (e.g., silicon wafer), which can severely limit the utility of the (preferably) cleaning process.

In accordance with preferred embodiments of the present invention, it is important to purify the $CO_2$ gas before it can be used for cleaning the wafer or other article. According to investigations by the inventors herewith, the best grade $CO_2$ available in the market tends to contain as much as about 5 PPB of hydrocarbons. In accordance with preferred embodiments of the present invention, however, the level of contaminant such as hydrocarbons is reduced by orders of magnitude to about 0.01 PPT before it is utilized in a subsequent process, which may be, for example, a wafer cleaning process. Removing the hydrocarbon contaminant from $CO_2$ has been determined to be a very challenging problem In fact, it has been very difficult to accomplish this task because of the minute amounts of hydrocarbon needed to be removed, given that hydrocarbons tend to have excellent solubility in $CO_2$.

Preferred embodiments of the present invention preferably utilize a series of filtering/purification processes to remove hydrocarbon contaminants from the $CO_2$. In accordance with such preferred embodiments, a filtering/purification process is provided that desirably utilizes one or more of condensation of the hydrocarbon; particulate filtration; chemical filtration using activated filters; and catalytic oxidation. The schematic provided in FIG. 22 illustrates outlines a desirable combination of distinct filtering/purification steps or implements in an exemplary preferred embodiment.

$CO_2$ gas is provided by source 300, which preferably provides the $CO_2$ gas at about 300 to 900 psia pressure range, which preferably flows through condensing device 301. Condensing device 301 preferably removes a majority of the contaminant, preferably hydrocarbon. Condensing device 301 preferably removes hydrocarbons by condensation and through surface tension phenomenon and gravity force.

The gas preferably will then be heated in heater 302 to prepare it for a subsequent, preferably catalytic, oxidation process. The preferably catalytic reduction/oxidation process is implemented in catalytic reactor 303, which preferably is heated via heater 303A to a temperature to provide more optimum conditions for catalytic reduction/oxidization of the hydrocarbons, assisted by catalyst 303B. Catalyst 303B may be of a type known in the art, that serves to facilitate and accelerate the reduction/oxidization of hydrocarbons. For example, catalyst 303B may be Titanium Dioxide (TiO2) or other suitable catalytic material, which could be enhanced by the use of UV light (the use of UV light on such a catalyst is known in the art). Catalyst 303B preferably is imbedded into, or integrated with, heater 303A in order to maintain the preferably high temperature required for effective burning of residual hydrocarbon.

It should be noted that $CO_2$ normally contains oxygen that is required for the catalytic oxidation process. If, however, the amount of oxygen in the $CO_2$ is not sufficient to enable conditions for a stoichiometric reaction, oxygen optionally can be injected into the gas line via inlet 311, such as illustrated in FIG. 22. It should be further noted that, in certain embodiments, heater 302 is optional or integrated into heated catalytic reactor 303.

In accordance with preferred embodiments, and as further illustrated in FIG. 22, the $CO_2$ gas preferably is then passed through chemical filter 304, which preferably consists of a series of chemical filters 304, which preferably contain what is known in the art as activated carbon for hydrocarbon adsorption. In accordance with preferred embodiments, it should be noted that carbon filter(s) 304 is/are utilized towards the final stage of the filtering/purification process because it adsorbs the hydrocarbon and needs to be replaced (e.g., when nearing or at saturation). As a result, in accordance with the present invention, employing it at or near the last stage will increase the lifetime and decrease the replacement frequency of filter(s) 304, and thus desirably reduce the down time of the processing tool.

In accordance with preferred embodiments, and as further illustrated in FIG. 22, the $CO_2$ gas preferably is then passed through particle filter 305 (or a series of particle filters 305) to remove any particles that may be present in the $CO_2$ or that were shed into the $CO_2$ in the preceding carbon filtering process. As further illustrated, in certain preferred embodiments liquid $CO_2$ is required for, for example, nozzle flow. In such embodiments, the gas is condensed through chiller 306. In embodiments where gas is required in the nozzle or subsequent process, chiller 306 is omitted, and the gas preferably passes via outlet 310 through the particle filters to the nozzle system (or other system implement).

As will be appreciated from the exemplary preferred embodiment illustrated in FIG. 22, in accordance with preferred embodiments, the cryogenic cleaning medium consists of carbon dioxide that is filtered, preferably with a multi-stage, multi-mode/type filter in process. As commercial sources of carbon dioxide tend to include undesirable amounts of hydrocarbons (due, at least in part, to the solubility of many hydrocarbons in carbon dioxide), a preferably multi-stage filtering process that removes contaminants such as hydrocarbons is implemented. Additional details/options in accordance with such embodiments will now be described. In preferred embodiments, the filtering process utilizes one or more of the following. A coalescent-type, preferably condensing-type, filter 301 is provided that preferably removes the bulk of the contaminant (typically hydrocarbon). Filter 301 preferably consists of multiple stages, such two to four stages, with three stages used in certain preferred embodiments (three separate filters). A heated/catalytic reactor 303 preferably removes contaminants such as hydrocarbons. High temperature pre-heater 302 preferably is utilized in certain embodiments to heat the $CO_2$ to accelerate the catalytic reaction. The temperature range preferably is about 250° C.–1000° C., with the preferred set point temperature about 500° C. Heated catalyst 303B (preferably multi-stage) is provided, with heater 303A used to maintain a constant temperature for the catalytic process (preferred temperature ranges may be as stated previously). A multistage catalytic process preferably is utilized that removes contaminants such as hydrocarbons based on multi-heater/catalyst stages. A multi-stage catalytic process preferably is utilized in order to, for example, ensure a near complete reduction/oxidation of hydrocarbons, with the multistage process helping ensure that the majority of $CO_2$ molecules will come in contact with one or more catalytic surface. Activated (which may also include non-activated) carbon filters 304 (preferably replaceable) preferably are utilized to extract residual contaminants such as hydrocarbons in the $CO_2$ after the catalytic oxidation. In preferred embodiments, filter(s) is/are implemented downstream of the catalytic process, where the amount of hydrocarbon in the $CO_2$ is greatly reduced; as a result, filter replacement will be less frequent. Particle filter 305, preferably a multistage filtration system, consists of one or more preferably ceramic core particulate filters to remove larger particles (e.g., 0.1 micron and larger), which preferably is followed by a preferably all metal electronic grade filter to remove finer particles (e.g., 0.005–0.1 microns). Chiller 306 preferably is provided to control the quality and the conditions of the $CO_2$ entering the nozzle (for a nozzle-based cleaning process, etc.). The core of chiller 306 preferably is electro-polished stainless steel to prevent contamination of the $CO_2$.

Although the invention has been described in conjunction with specific preferred and other embodiments, it is evident that many substitutions, alternatives and variations will be apparent to those skilled in the art in light of the foregoing description. Accordingly, the invention is intended to embrace all of the alternatives and variations that fall within the spirit and scope of the appended claims. For example, it should be understood that, in accordance with the various alternative embodiments described herein, various systems, and uses and methods based on such systems, may be obtained. The various refinements and alternative and additional features also described may be combined to provide additional advantageous combinations and the like in accordance with the present invention. Also as will be understood by those skilled in the art based on the foregoing description, various aspects of the preferred embodiments may be used in various subcombinations to achieve at least certain of the benefits and attributes described herein, and such subcombinations also are within the scope of the present invention. All such refinements, enhancements and further uses of the present invention are within the scope of the present invention.

What is claimed is:

1. A method for manufacturing an article, the article having polymeric residue that is to be removed during the manufacture of the article, comprising the steps of:
introducing the article into a controlled environment of a processing tool, the processing tool having at least first and second processing chambers;
generating free radicals from one or more reactant gases remote from the first and second processing chambers;
introducing the free radicals into the first processing chamber, wherein the free radicals react with the polymeric residue; and
supplying a cryogenic cleaning medium into the second processing chamber, wherein the cryogenic cleaning medium removes the polymeric residue present after the free radicals react with the polymeric residue;
wherein the reactant gases are selected to facilitate removal of the polymeric residue with the cryogenic cleaning medium.

2. The method of claim 1, further comprising the steps of:
applying RF energy to one or more electrodes in the first processing chamber;
generating an RF plasma, wherein the RF plasma is generated from the reactant gases and/or from the free radicals, wherein the RF plasma reacts with the polymeric residue;
wherein the step of supplying a cryogenic cleaning medium operates to remove polymeric residue present after the RF plasma reacts with the polymeric residue.

3. The method of claim 1, wherein the cryogenic cleaning medium is supplied in an oscillatory, vibratory or pulsating manner.

4. The method of claim 1, wherein the polymeric residue results from a photoresist removal process.

5. The method of claim 1, wherein the cryogenic cleaning medium is subjected to a multi-stage, multi-mode filtering process prior to being supplied to the second processing chamber.

6. The method of claim 1, wherein the first processing chamber provides plasma processing but not cryogenic processing.

7. The method of claim 1, wherein the second processing chamber provides cryogenic processing but not plasma processing.

8. The method of claim 1, wherein each of the first and second processing chambers provide plasma processing and cryogenic processing.

9. The method of claim 1, wherein the cryogenic cleaning medium is supplied via a nozzle assembly that sweeps across the article.

10. The method of claim 9, wherein the nozzle assembly has a non-linear shape that corresponds to a shape of the article.

11. A method for manufacturing an article, the article having polymeric residue to be removed during the manufacture of the article, comprising the steps of:
introducing the article into a controlled environment of a processing tool, the processing tool having at least first and second processing chambers;
applying RF energy to one or more electrodes in the first processing chamber;
generating an RF plasma, wherein the RF plasma is generated based on one or more reactant gases, wherein the RF plasma reacts with the polymeric residue;
supplying a cryogenic cleaning medium into the second processing chamber, wherein the cryogenic cleaning medium operates to remove polymeric residue present after the RF plasma reacts with the polymeric residue;
wherein the reactant gases are selected to facilitate removal of the polymeric residue with the cryogenic cleaning medium.

12. The method of claim 11, wherein the cryogenic cleaning medium is supplied in an oscillatory, vibratory or pulsating manner.

13. The method of claim 11, wherein the polymeric residue results from a photoresist removal process.

14. The method of claim 11, wherein the cryogenic cleaning medium is subjected to a multi-stage, multi-mode filtering process prior to being supplied to the second processing chamber.

15. The method of claim 11, wherein the first processing chamber provides plasma processing but not cryogenic processing.

16. The method of claim 11, wherein the second processing chamber provides cryogenic processing but not plasma processing.

17. The method of claim 11, wherein each of the first and second processing chambers provide plasma processing and cryogenic processing.

18. The method of claim 11, wherein the cryogenic cleaning medium is supplied via a nozzle assembly that sweeps across the article.

19. The method of claim 18, wherein the nozzle assembly has a non-linear shape that corresponds to a shape of the article.

* * * * *